US006872249B2

(12) United States Patent
Peng et al.

(10) Patent No.: US 6,872,249 B2
(45) Date of Patent: Mar. 29, 2005

(54) SYNTHESIS OF COLLOIDAL NANOCRYSTALS

(75) Inventors: Xiaogang Peng, Fayetteville, AR (US); Zuoyan Peng, Fayetteville, AR (US); Lianhua Qu, Fayetteville, AR (US)

(73) Assignee: The Board of Trustees of the University of Arkansas, Little Rock, AR (US)

( * ) Notice: Subject to any disclaimer, the term of this patent is extended or adjusted under 35 U.S.C. 154(b) by 0 days.

(21) Appl. No.: 09/971,780

(22) Filed: Oct. 4, 2001

(65) Prior Publication Data

US 2002/0066401 A1 Jun. 6, 2002

Related U.S. Application Data

(60) Provisional application No. 60/237,903, filed on Oct. 4, 2000, and provisional application No. 60/275,008, filed on Mar. 12, 2001.

(51) Int. Cl.$^7$ ................................................. C30B 7/08
(52) U.S. Cl. ............................ 117/68; 117/70; 117/988
(58) Field of Search .............................. 117/958, 68, 70

(56) References Cited

U.S. PATENT DOCUMENTS

| 6,179,912 B1 | | 1/2001 | Barbera-Guillem et al. | |
|---|---|---|---|---|
| 6,306,736 B1 | * | 10/2001 | Alivisatos et al. | ........... 438/497 |
| 6,444,143 B2 | * | 9/2002 | Bawendi et al. | ......... 252/310.6 |

OTHER PUBLICATIONS

Alivisatos, Ap, *Science* (1996) 271, 933–937.
Bruchez, M et al., Semiconductor Nanocrystals as Fluorescent Biological Labels. *Science* (1998) 281, 2013–2016.
Chan, WCW et al., Quantum Dot Bioconjugates for Ultrasensitive Nonisotopic Detection. *Science* (1998) 281, 2016–2018.
Cotton, FA, *Advanced Inorganic Chemistry* $6^{th}$ Edition, (1999), p. 421.
Dabbousi, BO et al., (CdSe)ZnS Core—Shell Quantum Dots: Synthesis and Characterization of a Size Series of Highly Luminescent Nanocrystallites. *Journal of Physical Chemistry B* (1997) 101, 9463–9475.
Heath, JR (editor). Accounts of Chemical Research (1999).
Huynh, W et al., CdSe Nanocrystal Rods/Poly(3–Hexylthiophene) Composite Photovoltaic Devices. *Advanced Materials* (1999) 11,923–927.
Mattousi, H et al., Electroluminescence from Heterostructures of Poly(Phenylene Vinylene) and Inorganic CdSe Nanocrystals. *Journal of Applied Physica* (1998) 83, 7965–7974.

(Continued)

*Primary Examiner*—Robert Kunemund
(74) *Attorney, Agent, or Firm*—Kilpatrick Stockton LLP; Charles W. Calkins; J. Clinton Wimbish

(57) ABSTRACT

A method of synthesizing colloidal nanocrystals is disclosed using metal oxides or metal salts as a precursor. The metal oxides or metal salts are combined with a ligand and then heated in combination with a coordinating solvent. Upon heating, the metal oxides or salts are converted to stable soluble metal complexes. The metal complexes are formed by cationic species combining with the ligands and/or with the coordinating solvent. Finally, an elemental chalcogenic precursor, for example, Se, Te, or S, is introduced into the soluble metal complex to complete the formation of the nanocrystals at a controllable rate. High-quality CdSe, CdTe, and CdS nanocrystals are produced when CdO is used as the cadmium precursor. With the present method, the size, size distribution, and shape (dots or rods) of the resulting nanocrystals can be controlled during growth. For example, the resulting nanocrystals are nearly monodisperse without any size separation. Further, the method represents a major step towards a green chemistry approach for synthesizing high-quality semiconductor nanocrystals.

74 Claims, 26 Drawing Sheets

OTHER PUBLICATIONS

Murray, CB et al., Synthesis and Characterization of Nearly Monodisperse CdE (E=S, Se, Te) Semiconductor Nanocrystallites. *Journal of the American Chemical Society* (1993), 155. 8706–8715.

Peng, XG et al., Shape Control of CdSe Nanocrystals. *Nature* (2000), 404, 59–61.

Peng, XG et al., Kinetics of II–VI and III–V Colloidal Semiconductor Nanocrystal Growth: "Focusing" of Size Distributions. *Journal of the American Chemical Society* (1998), 120, 5343–5344.

Peng, ZA et al., Formation of High–quality CdTe, CdSe, and CdS Nanocrystals Using CdO as Precursor. *Journal of the American Chemical Society* (2001), 123, 183–184.

Peng, ZA et al., Mechanisms of the Shape Evolution of CdSe Nanocrystals. *Journal of the American Chemical Society* (2001) 123 1389–1395.

Peng, XG et al., Epitaxial Growth of Highly Luminescent CdSe/CdS Core/Shell Nanocrystals with Photostability and Electronic Accessibility. *Journal of the American Chemical Society* (1997) 119, 7019–7029.

Peng, ZA and Peng, XG, Nearly Monodisperse and Shape–Controlled CdSe Nanocrystals via Alternative Routes: Nucleation and Growth, *J. Am. Chem. Soc.* Articles 2–21, 2002 (submitted).

Schlamp, MC et al., Improved Efficiencies in Light Emitting Diodes Made with CdSe (CdS) Core/Shell Type Nanocrystals and a Semiconducting Polymer. *Journal of Applied Physics* (1997) 82, 5837–5842.

Vossmeyer, T et al., CdS Nanoclusters: Synthesis, Characterization, Size Dependent Oscillator Strength. Temperature Shift of the Excitonic Transition Energy, and Reversible Absorbance Shift. *Journal of Physical Chemistry* (1994) 98, 7665–7673.

A typical synthesis for CdTe nanocrystals . . . .

* cited by examiner

SYNTHESIS OF COLLOIDAL NANOCRYSTALS

CROSS REFERENCE TO RELATED APPLICATIONS

This application claims the benefit of U.S. Provisional Application Ser. No. 60/237,903 filed Oct. 4, 2000 and U.S. Provisional Application Ser. No. 60/275,008 filed Mar. 12, 2001, which are incorporated by reference in their entirety.

BACKGROUND OF THE INVENTION

The present invention relates generally to the synthesis of high-quality, colloidal nanocrystals, and more particularly to the use of metal oxides and metal salts as precursors to produce high-quality nanocrystals.

High-quality colloidal semiconductor nanocrystals are defined as nanometer sized, single crystalline fragments of the corresponding bulk crystals, which have a controlled size, distribution, and are soluble or dispersible in desired solvents and media. Semiconductor nanocrystals, especially cadmium telluride (CdTe), cadmium selenide (CdSe) and cadmium sulfide (CdS), are of great interest for fundamental research and technical applications due to their size and shape dependent properties and flexible processing chemistry. High-quality CdSe and CdTe nanocrystals with nearly monodisperse dots or elongated rods are actively being developed by industry as biological labeling reagents and for other applications such as LEDs.

Synthesis of high-quality semiconductor nanocrystals has a critical role in this very active field. The synthesis of CdSe nanocrystals using dimethyl cadmium (Cd (CH$_3$)$_2$) as the cadmium precursor has been well developed since first reported by Murray et al. [*Journal of the American Chemical Society* (1993), 115, 8706–8715]. Barbera-Guillem, et al. [U.S. Pat. No. 6,179,912] disclose a continuous flow process for the production of semiconductor nanocrystals using the method of Murray et al. One method for the synthesis of colloidal inorganic nanocrystals is the method developed for II–VI semiconductor nanocrystals as described in Peng et al. [*Nature* (2000), 404, 69–61] and Peng et al. [*Journal of the American Chemical Society*, (1998), 120, 5343–5344]. This synthetic method requires the use of metal precursors, such as dimethyl cadmium, which are extremely toxic, pyrophoric, expensive, and unstable at room temperature. At the typical injection temperatures (340–360° C.) required for nanocrystal synthesis using Cd(CH$_3$)$_2$ as the precursor, Cd(CH$_3$)$_2$ is explosive by releasing large amounts of gas. For these reasons, the Cd(CH$_3$)$_2$ related synthesis methods require very restrictive equipment and conditions and, thus, are not suitable for large-scale synthesis.

Monodispersity is another critical factor to be considered in synthesizing nanocrystals. Currently, CdSe nanocrystals are the only nanocrystals having a relatively monodisperse size distribution that can be directly synthesized by using dimethyl cadmium as the precursor. In the *Journal of the American Chemical Society*[(1998), 120, 5343–5344] Peng et al. reported that nanocrystal size and size distribution could be quantitatively determined by analyzing the growth kinetics of CdSe nanocrystals in a very hot non-aqueous solution. When the monomer concentration is controlled in the initial reaction solution, the size distribution of CdSe nanocrystals can reach close to monodispersity with a relatively low standard deviation (about 5%). This phenomenon is referred to as "focusing" of the size distribution. The size of the CdSe nanocrystals can be controlled by the amount of time allowed for growth. Recently, Peng et al. reported [*Nature* (2000), 404, 59–61] that the shape of CdSe nanocrystals can also be varied between dots (close to spherical shapes) and rods (elongated shapes). By comparison, the size and size distribution of CdTe and CdS nanocrystals cannot be controlled as well as the CdSe nanocrystals synthesized by the Cd(CH$_3$)$_2$ related method. There, thus, remains a need to develop a method for synthesizing high-quality semiconductor nanocrystals, whereby the size, size distribution, and shape of the nanocrystals can be well controlled during the growth stage.

SUMMARY OF THE INVENTION

The present invention overcomes the disadvantages of Cd(CH$_3$)$_2$ related schemes by providing a novel method for synthesizing high-quality nanocrystals utilizing inexpensive and non-pyrophoric materials. The method of the present invention utilizes metal oxides or metal salts as precursors, which are common, safe, and low-cost compounds to produce the nanocrystals of interest. The metal salts include metal halides, metal carboxylates, metal carbonates, or any other salts that can be dissolved in the reaction media (ligand and coordinating solvent) described below. The metals include most transition metals (i.e., Cd, Zn, Hg, Cu, Ag, Ni, Co, Fe, Mn, Ti, Zr, etc.), group III metals (i.e., Al, Ga, In) and group IV metals (i.e., Sn, Pb), as described in F.A. Cotton et al. [*Advanced Inorganic Chemistry*, 6th Edition, (1999)].

The metal oxides or metal salts are combined with a ligand and a coordinating solvent, resulting in the formation of a soluble metal complex. A ligand for a cationic species is defined as a ligand that can bind to the precursor to form a complex that is soluble in certain compounds. The solubility of the complex should be sufficient for the synthesis of the nanocrystals using the reaction conditions described herein. The ligands include long-chain fatty amines or acids, phosphonic acids, and phosphine oxides. Specific species within these groups include dodecylamine (DA), hexadecylamine (HA), octadecylamine (OA), stearic acid (SA), lauric acid (LA), hexylphosphonic acid (HPA), tetrad ecylphosphonic acid (TDPA), and trioctylphosphine oxide (TOPO). The coordinating solvent refers to any compound which binds to the starting precursors or the resulting nanocrystals. The starting precursors include the metal and non-metal precursors.

In one embodiment, a high-boiling-point coordinating solvent, such as TOPO, is used. A high-boiling point coordinating solvent includes a solvent whose boiling point is between 100°–400° C. For colloidal nanocrystal synthesis, a coordinating solvent is always required. The ligand and the coordinating solvent may be the same chemical. For example, long-chain fatty acids and amines and TOPO may serve both the solvent and the ligand functions if Cd(Ac)$_2$ is used as the precursor.

If the melting point of the ligand is too high, the ligand will not function as a useful coordinating solvent because it will remain solid at elevated temperatures. With this scenario, the ligand must be used in combination with a separate solvent. For example, phosphonic acids may serve only as ligands and must be combined with a coordinating solvent. If CdO or CdCO$_3$ is the precursor, amines and TOPO cannot be used as the ligands and can only be used as coordinating solvents. If the precursor and the resulting nanocrystals are all soluble in the chosen coordinating solvent, no additional ligands are needed. If either the metal precursor or the resulting nanocrystals are insoluble in the chosen coordinating solvent alone, a ligand must be added.

Upon heating, the metal oxides or salts are converted to stable soluble metal complexes. Therefore, metal complexes can be formed by precursor species combined with the ligands alone, or if a solvent is used, the soluble complexes can be formed by combining the precursor species with the ligand/solvent molecules.

For example, using the precursor of cadmium oxide (CdO) or cadmium acetate ($Cd(Ac)_2$), in which a ligand such as phosphonic acid or carboxylic acid is added, the resulting cadmium complexes are either cadmium phosphonate or cadmium carboxylate, respectively. Finally, an elemental chalcogenic precursor (such as Se, Te, or S) is introduced into the dissolved cadmium complex to complete the formation of the nanocrystals at a controllable rate. For instance, using CdO as a precursor, one can synthesize CdSe, CdTe, CdS or other types of cadmium nanocrystals just by varying the precursors.

Experimental results revealed that the method of the present invention generated nanocrystals with high crystallinity, high monodispersity, and high reproducibility. The metal precursors are not pyrophoric and are much less toxic than those required for use with the current synthetic methods which use dimethyl cadmium. Thus, the present metal precursors can be manipulated under common laboratory conditions. More importantly, the present invention provides a method for producing colloidal nanocrystals for large scale synthesis.

It is therefore an object of the present invention to provide a method for synthesizing nanocrystals utilizing inexpensive and non-pyrophoric materials.

In one aspect of the present invention, a method of synthesizing colloidal nanocrystals is disclosed, comprising the steps of: (a) combining a metal oxide or metal salt precursor, a ligand, and a coordinating solvent to form a metal complex; and (b) admixing an elemental chalcogenic precursor with the metal complex at a temperature sufficient to form nanocrystals. A biological labeling reagent and LED may be produced by this method.

In another aspect, the coordinating solvent is a high-boiling point coordinating solvent having a boiling point range between about 100° to about 400° C.

In another aspect of the present invention, a method of synthesizing CdSe rods is disclosed, comprising the steps of: (a) combining a cadmium precursor and a coordinating solvent to form a solution upon heating; wherein the cadmium precursor is selected from the group consisting of Cd-ODPA complex, Cd-TDPA complex, and any other Cd phosphonic complex; and (b) admixing an elemental chalcogenic precursor with the solution at a temperature sufficient to form CdSe rods, wherein the chalcogenic precursor is selected from the group consisting of Se-TBP, Se-TOP, and any other Se phosphine compound.

In another aspect of the present invention, a method of synthesizing rice-shaped CdSe nanocrystals is disclosed, comprising the steps of: (a) combining a cadmium precursor and a coordinating solvent to form a solution upon heating, wherein the cadmium precursor is selected from the group consisting of Cd-ODPA complex, Cd-TDPA complex, and any other Cd phosphonic complex; and (b) admixing an elemental chalcogenic precursor with the solution at a temperature sufficient to form rice-shaped CdSe nanocrystals, wherein the chalcogenic precursor is selected from the group consisting of Se-TBP, Se-TOP, and any other Se phosphine compound.

In yet another aspect of the present invention, a method of synthesizing branched CdSe nanocrystals is disclosed, comprising the steps of: (a) combining a cadmium precursor and a coordinating solvent to form a solution upon heating, wherein the cadmium precursor is selected from the group consisting of Cd-ODPA complex, Cd-TDPA complex, and any other Cd phosphonic complex; and (b) admixing an elemental chalcogenic precursor with the solution at a temperature sufficient to form branched CdSe nanocrystals, wherein the chalcogenic precursor is selected from the group consisting of Se-TBP, Se-TOP, and any other Se phosphine compound.

These and other features, objects and advantages of the present invention will become better understood from a consideration of the following detailed description of the preferred embodiments and appended claims in conjunction with the drawings described as follows:

DETAILED DESCRIPTION OF THE INVENTION

Figure 1A:
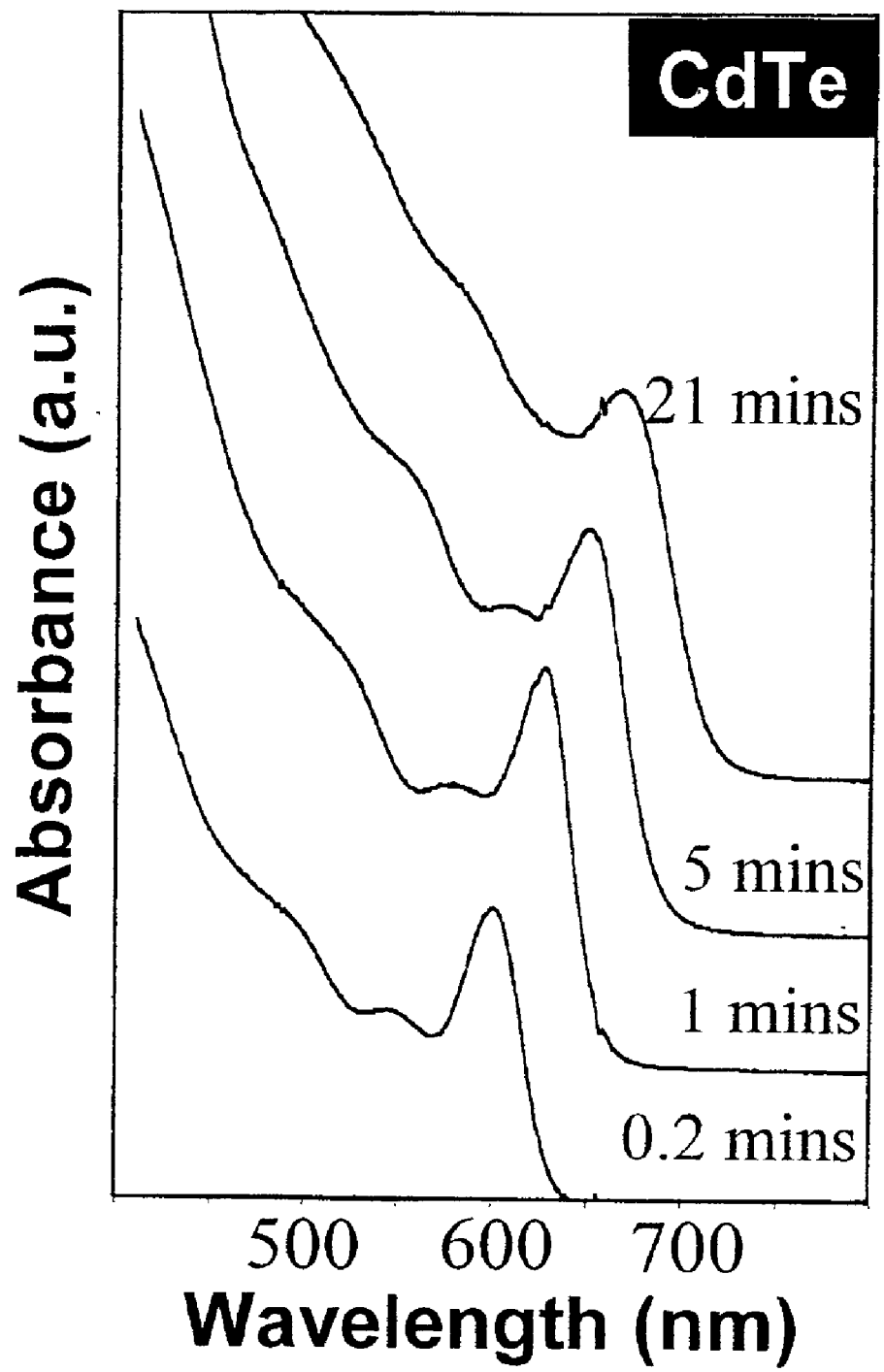
FIG. 1(a) is a graph illustrating the temporal evolution of size and size distribution of CdTe nanocrystals as quantified by UV-Vis absorption.
Figure 1B:
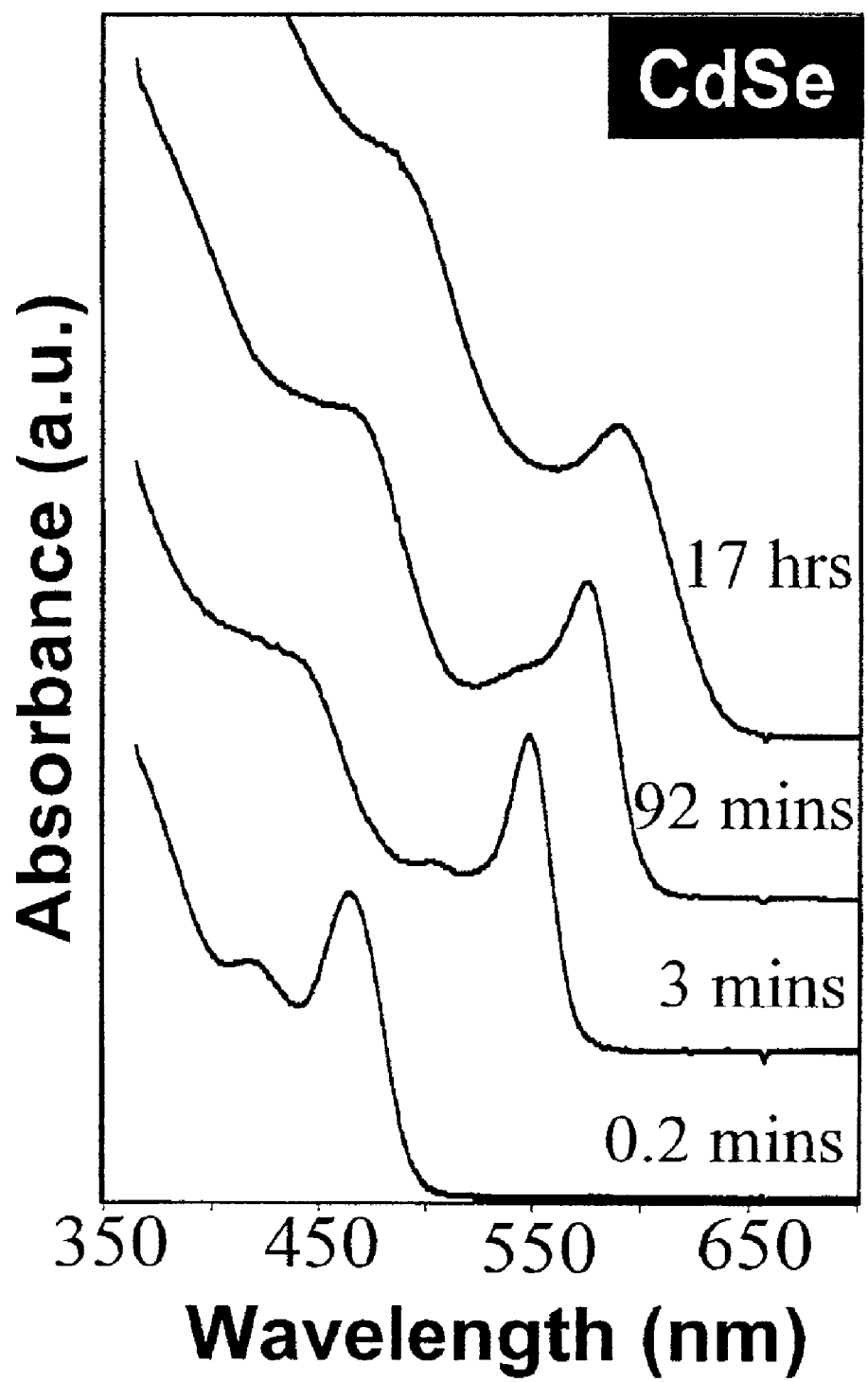
FIG. 1(b) is a graph illustrating the temporal evolution of size and size distribution of CdSe nanocrystals as quantified by UV-Vis absorption.
Figure 1C:
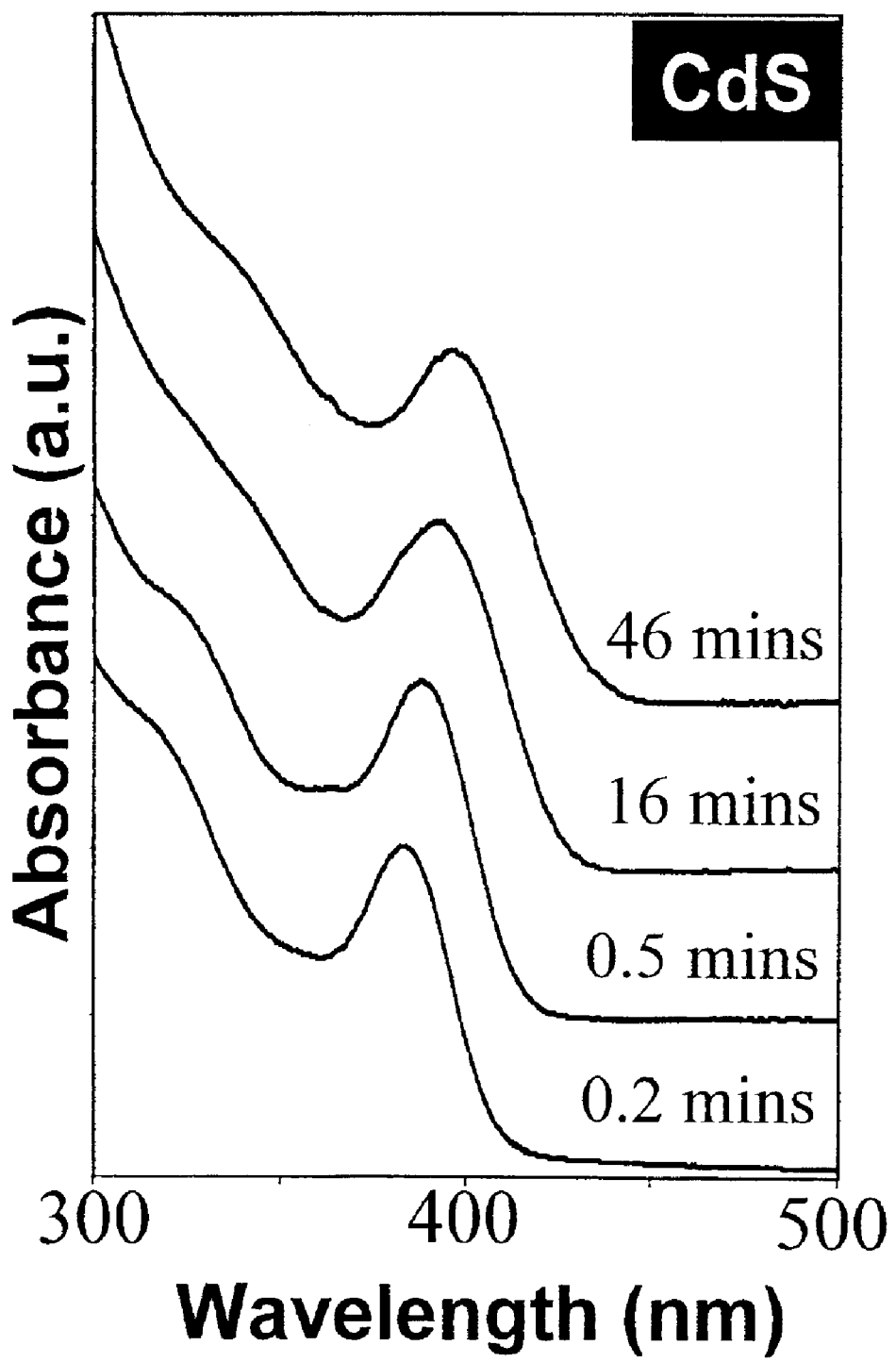
FIG. 1(c) is a graph illustrating the temporal evolution of size and size distribution of CdS nanocrystals as quantified by UV-Vis absorption.

With reference to FIGS. 1–9, the preferred embodiments of the present invention are disclosed using nanocrystals derived from cadmium precursors as the following examples. Such examples are presented for illustration and discussion purposes only and should not be construed as limiting the scope of the present invention.

The present invention discloses the use of cadmium compounds, such as cadmium oxides or other cadmium salts, as a precursor replacement for dimethyl cadmium (Cd(CH$_3$)$_2$). Overall, the use of these compounds resulted in significant improvements in the quality of the nanocrystals. This novel synthetic method produces monodisperse cadmium chalcogenide quantum dots and quantum rods without the need for size selective precipitation [See Murray et al., *Journal of the American Chemical Society*, (1993), 115, 8706–8715]. Using the method of the present invention, cadmium nanocrystal production is simple and reproducible (see FIG. 4). By contrast, the Cd(CH$_3$)$_2$ related methods are very hard to control and almost impossible to reproduce [See Peng et al., *Journal of the American Chemical Society*, (2001), 123, 183–184]. As an additional benefit, all the precursors used in the present invention are less expensive, safer, and less toxic than Cd(CH$_3$)$_2$. Additionally, the present precursors are not pyrophoric and require less restrictive conditions for producing nanocrystals. These advantages provide the basis for the potential use of the present method in industrial scale production of high-quality nanocrystals.

With the current method for synthesizing nanocrystals, dimethyl cadmium is decomposed in hot trioctylphosphine oxide (TOPO) to generate an insoluble metallic precipitate. When TOPO is combined with either hexylphosphonic acid (HPA) or tetradecylphosphonic acid (TDPA), the dimethyl cadmium is converted into a cadmium-HPA or cadmium-TDPA complex (Cd-HPA/Cd-TDPA). If the cadmium-to-phosphoric acid ratio is less than one, a colorless clear solution results. After the cadmium complex is formed, an injection of Se dissolved in tributylphosphine (TBP) will generate CdSe nanocrystals. In the method of the present invention, use of dimethyl cadmium as the precursor to nanocrystal formation is unnecessary, if a cadmium complex precursor is generated by other means.

The co-inventors of the present invention first synthesized and purified the cadmium HPA and cadmium TDPA complex (Cd-HPA and Cd-TDPA) from cadmium chloride (CdCl$_2$) as disclosed in Z. A. Peng and X. Peng [*Journal of the American Chemical Society*, (2001) 123, 183–184]. The resulting Cd-HPA/Cd-TDPA complex was subsequently combined with TOPO and heated to 300–360° C. to produce a clear colorless solution. An injection of selenium-TBP solution into this complex generated CdSe nanocrystals with a qualitative growth pattern mimicking that generated with Cd(CH$_3$)$_2$ as the precursor.

When cadmium oxide (CdO), cadmium acetate (Cd(Ac)$_2$), cadmium carbonate, or other cadmium salts formed by cadmium and an anion of a weak acid, are used as the cadmium source, the synthesis is even simpler. Nanocrystals can be synthesized without purifying the cadmium complex, which means the entire synthesis can be done in a "one pot or vessel" manner. For example, when a cadmium precursor such as Cd(Ac)$_2$ is combined with a ligand such as phosphonic acid, carboxylic acid, or an amine, a cadmium complex is formed. Finally, an elemental chalcogenic precursor (such as Se, Te, or S) is introduced into the cadmium complex to complete the formation of the nanocrystals. For all three cadmium chalcogenides, using CdO as the precursor within a single vessel will generate CdTe and CdSe quantum rods as demonstrated in the experimental examples below and shown in FIGS. 1(a–c), FIG. 2, and FIGS. 3(a–b).

The one pot or vessel approach to synthesizing cadmium chalcogenide nanocrystals does not work when cadmium chloride (CdCl$_2$), cadmium sulfide (CdSO$_4$) or other metal salts formed by the reaction of cadmium with a strong acid are used as cadmium precursors. This may be due to the relatively low stability of cadmium chalcogenides in acidic conditions compared to using cadmium precursors such as CdCl$_2$ and CdSO$_4$.

The growth reactions of semiconductor nanocrystals can be conveniently monitored by absorption and emission spectroscopy. Based on the theory of quantum confinement, the first absorption peak and the band edge emission of nanocrystals shift blue as the size decreases if the size of the nanocrystals is smaller than the Bohr radius of the exciton. The average size of semiconductor nanocrystals can be monitored by peak positions, while sharpness of the peaks indicates size distribution. Nanocrystals exhibiting quantum confinement effects are called quantum dots if dot-shaped, or quantum rods if rod-shaped.

Monodispersity is represented by a sharp absorption peak if the growth ceases in the "focusing of size distribution"

regime [Peng et al., *Journal of the American Chemical Society*, (1998), 120, 5343–5344]. As shown in FIGS. 1(*a*–*c*), 2, 5, 7(*a*–*f*), and 8(*a*–*c*), the size distribution of the cadmium chalcogenide nanocrystals is monodisperse at the focusing point of size distribution. The size and size distribution temporal evolution of the three cadmium chalcogenide nanocrystals possess a similar absorption and emission pattern to the CdSe nanocrystals formed by using $Cd(CH_3)_2$ as the precursor. Monodisperse CdSe, CdTe, and CdS nanocrystals can be synthetically produced without the need to use any size separating techniques.

Figure 5:
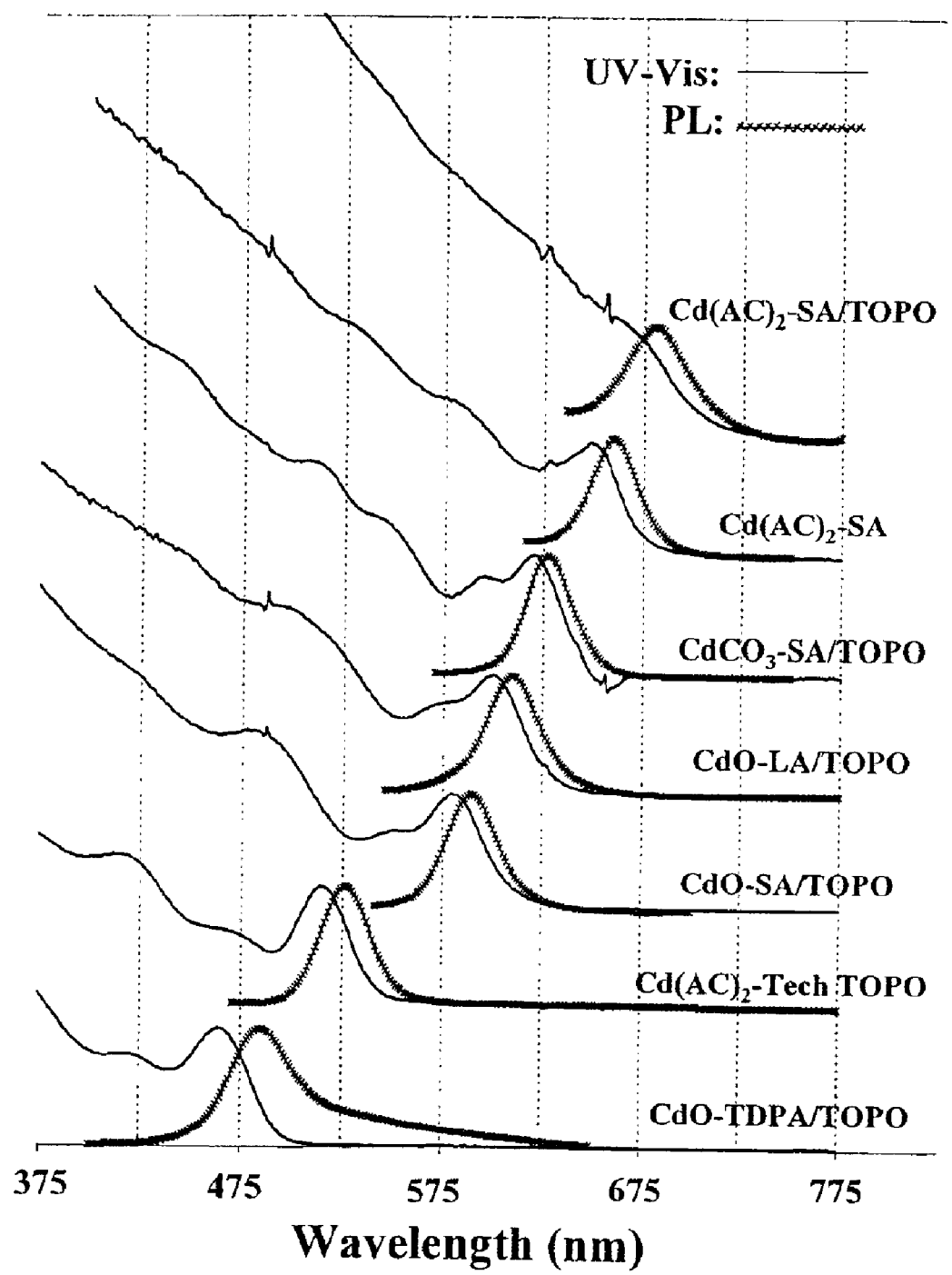
FIG. 5 is an UV-Vis and photoluminescence (PL) spectra of different sized wurtzite CdSe nanocrystals synthesized using different cadmium precursors, ligands, and solvents.
Figure 6A:
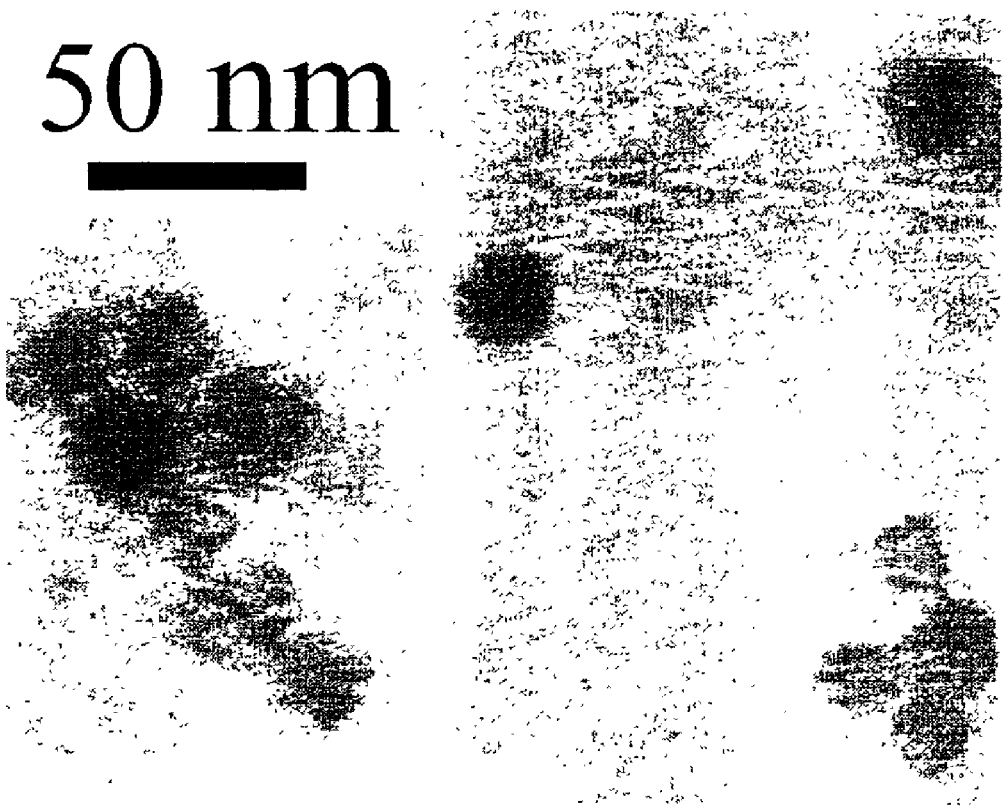
FIG. 6(a) is a transmission electron micrograph of wurtzite CdSe nanocrystals synthesized using $Cd(Ac)_2$ as the precursor, stearic acid as the solvent, and without additional size sorting.
Figure 6B:
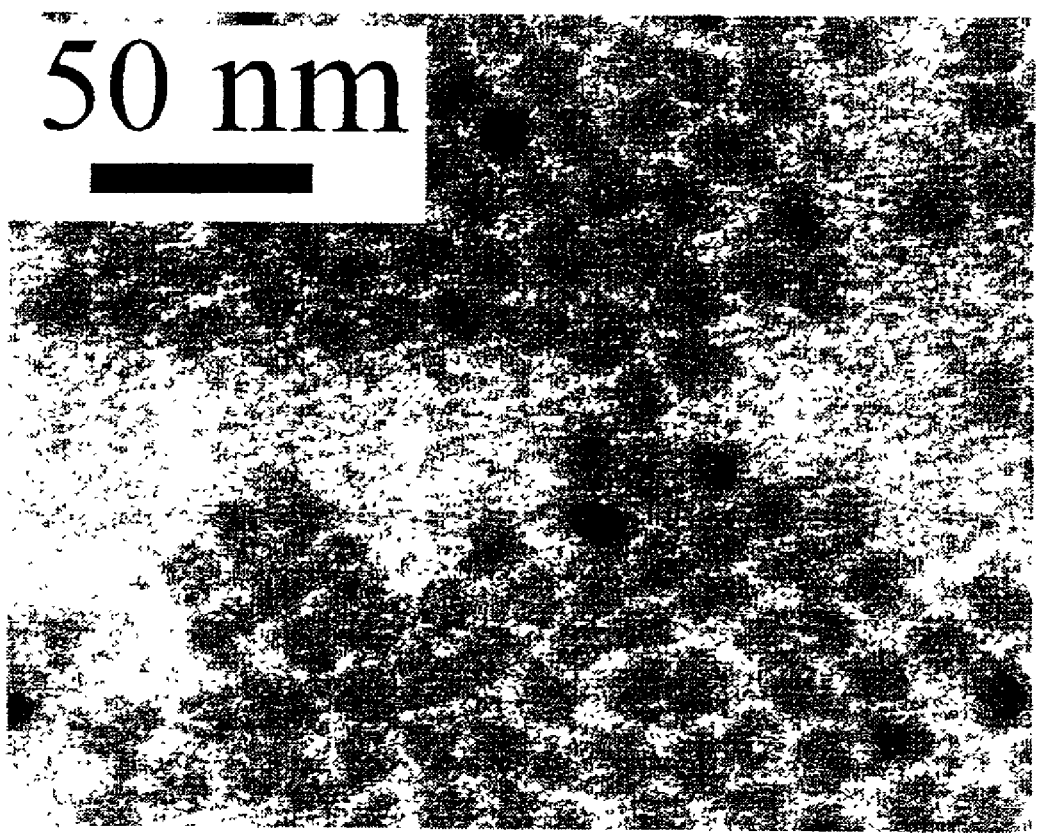
FIG. 6(b) is a transmission electron micrograph of wurtzite CdSe nanocrystals synthesized using $Cd(Ac)_2$ as the precursor, stearic acid as the solvent, and without additional size sorting.
Figure 6C:
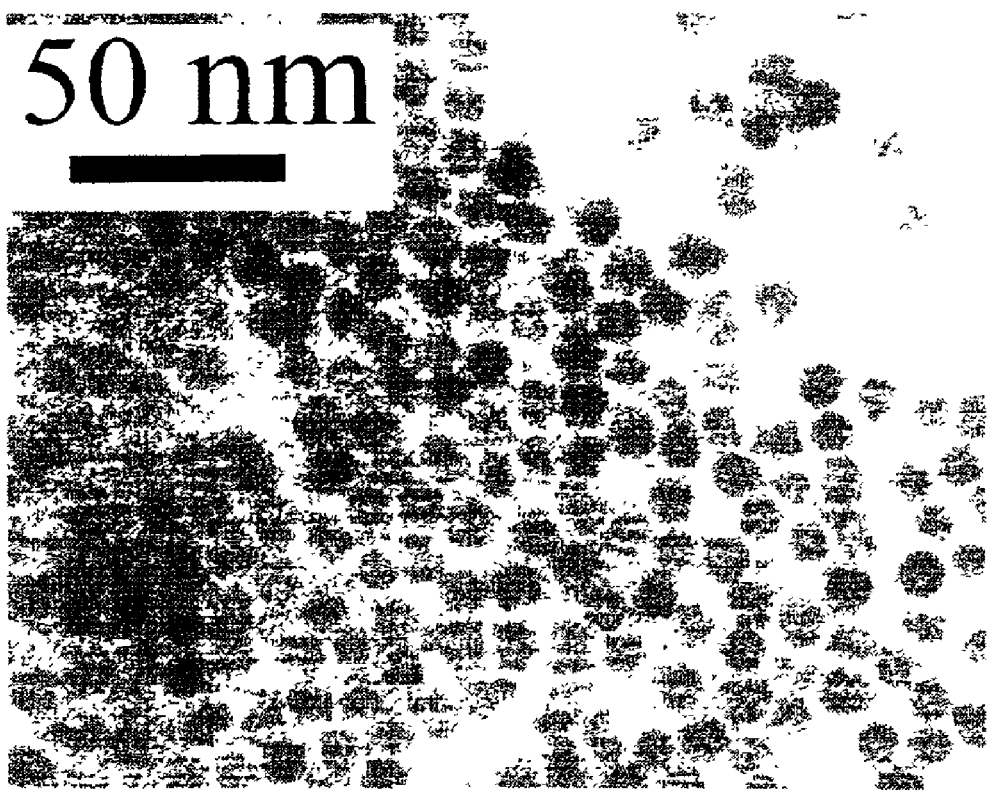
FIG. 6(c) is a transmission electron micrograph of wurtzite CdSe nanocrystals synthesized using $Cd(Ac)_2$ as the precursor, stearic acid as the solvent, and without additional size sorting.
Figure 6D:
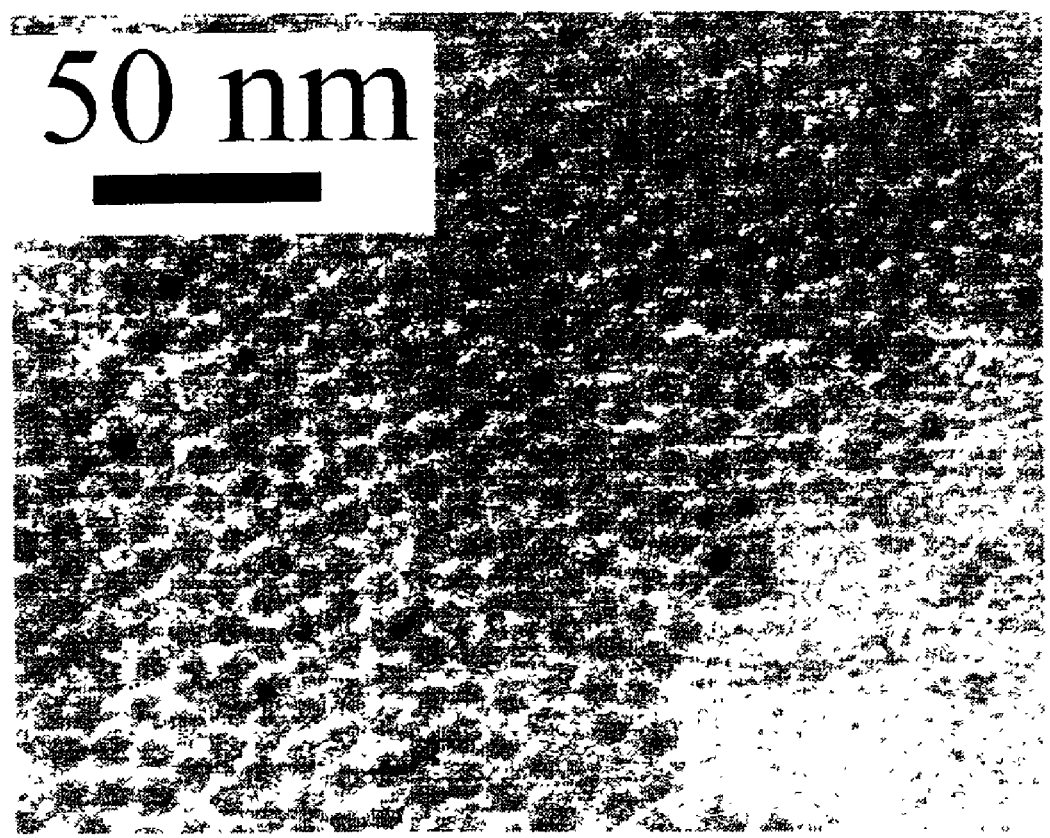
FIG. 6(d) is a transmission electron micrograph of wurtzite CdSe nanocrystals synthesized using $Cd(Ac)_2$ as the precursor, stearic acid as the solvent, and without additional size sorting.
Figure 6E:
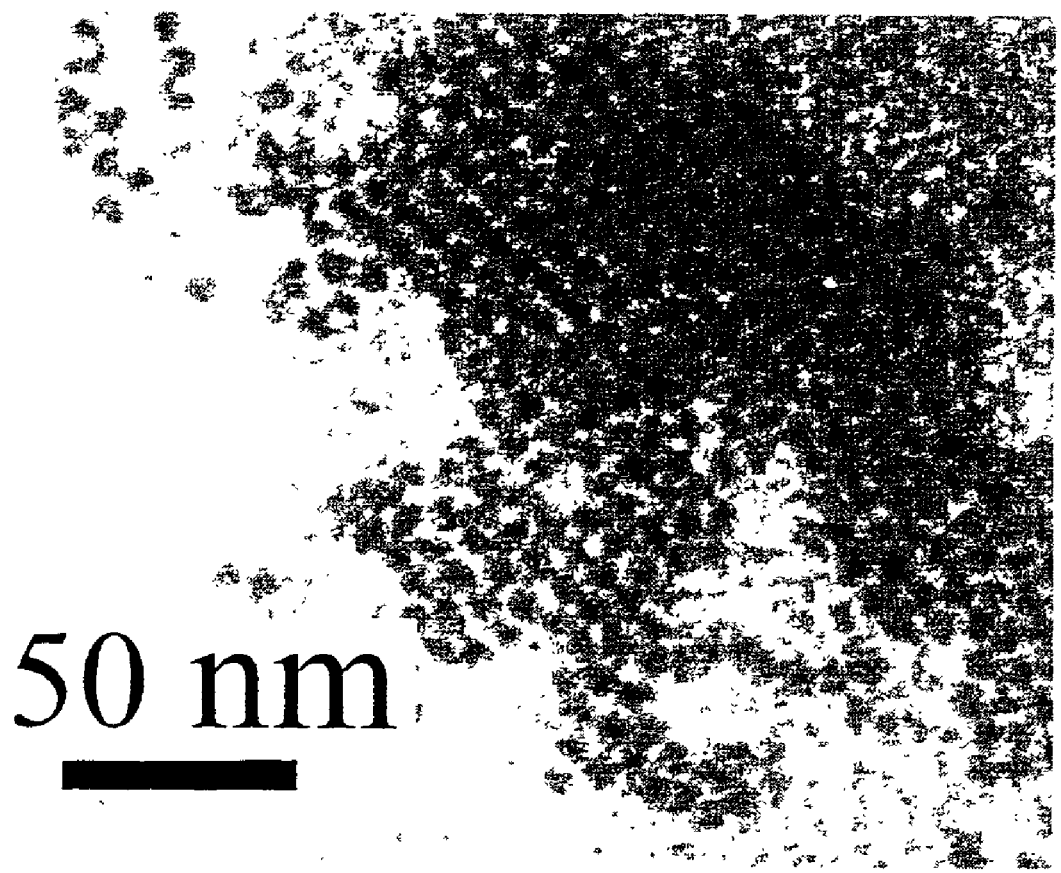
FIG. 6(e) is a transmission electron micrograph of wurtzite CdSe nanocrystals synthesized using $Cd(Ac)_2$ as the precursor, stearic acid as the solvent, and without additional size sorting.
Figure 6F:
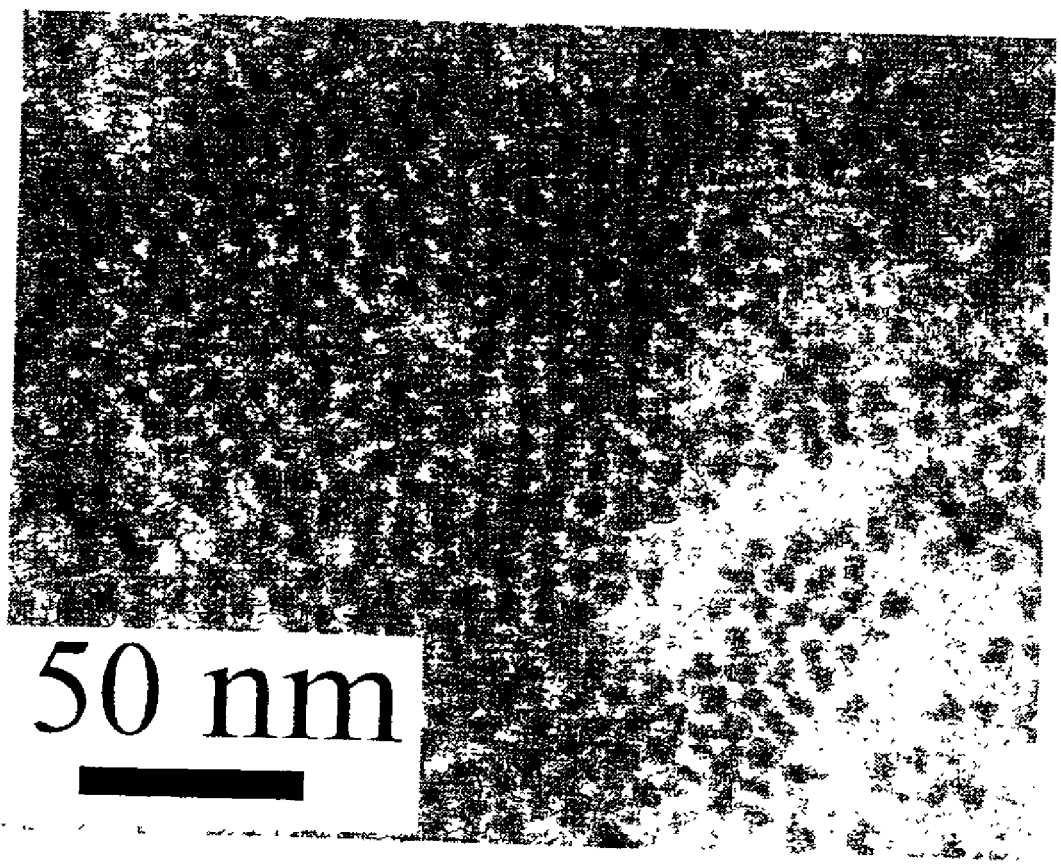
FIG. 6(f) is a transmission electron micrograph of wurtzite CdSe nanocrystals synthesized using $Cd(Ac)_2$ as the precursor, stearic acid as the solvent, and without additional size sorting.
Figure 6G:
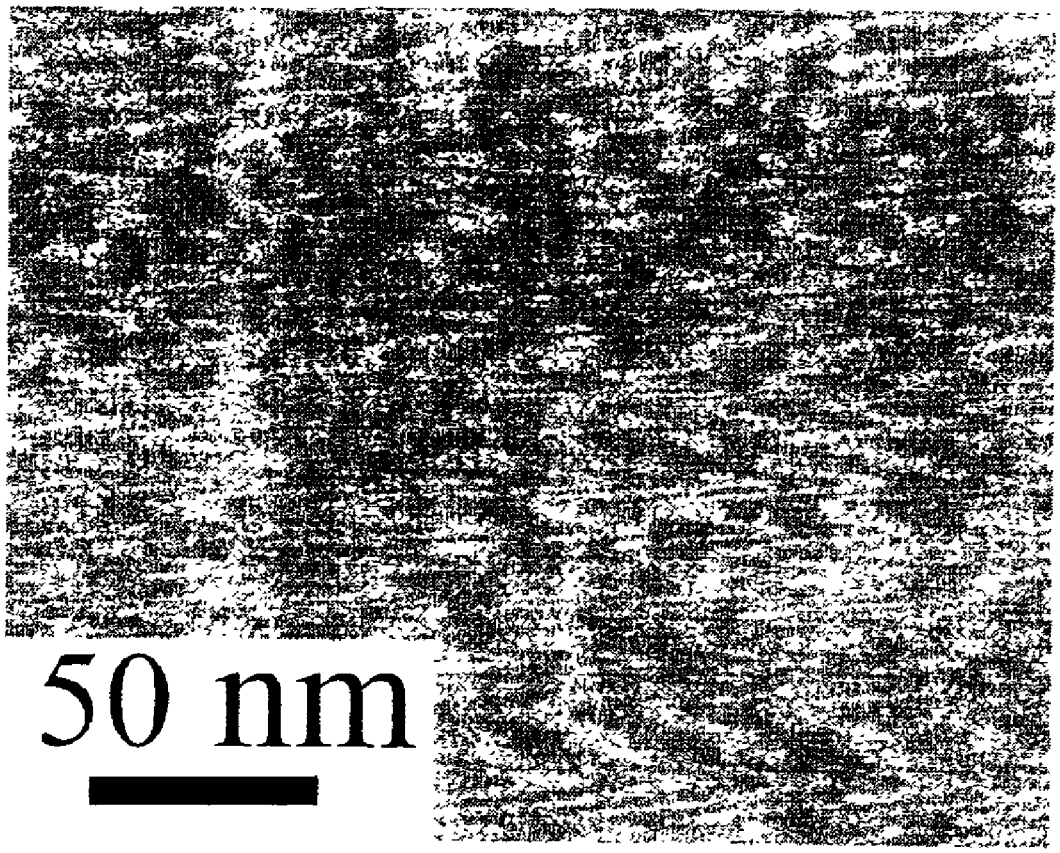
FIG. 6(g) is a transmission electron micrograph of wurtzite CdSe nanocrystals synthesized using Cd(Ac)$_2$ as the precursor, stearic acid as the solvent, and without additional size sorting.
Figure 6H:
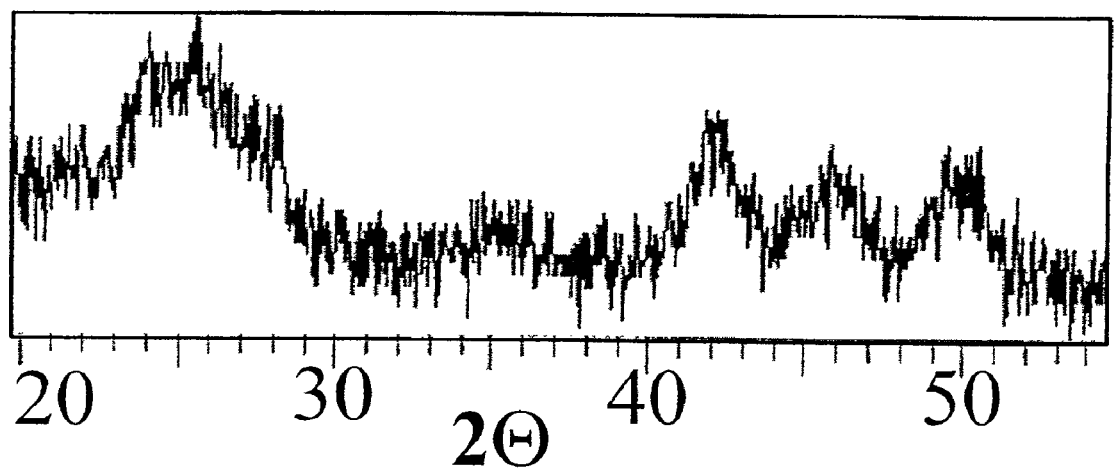
FIG. 6(h) is a powder x-ray diffraction pattern of a 6 nm-sized wurtzite CdSe nanocrystal sample demonstrating the highly crystalline features.
Figure 7A:
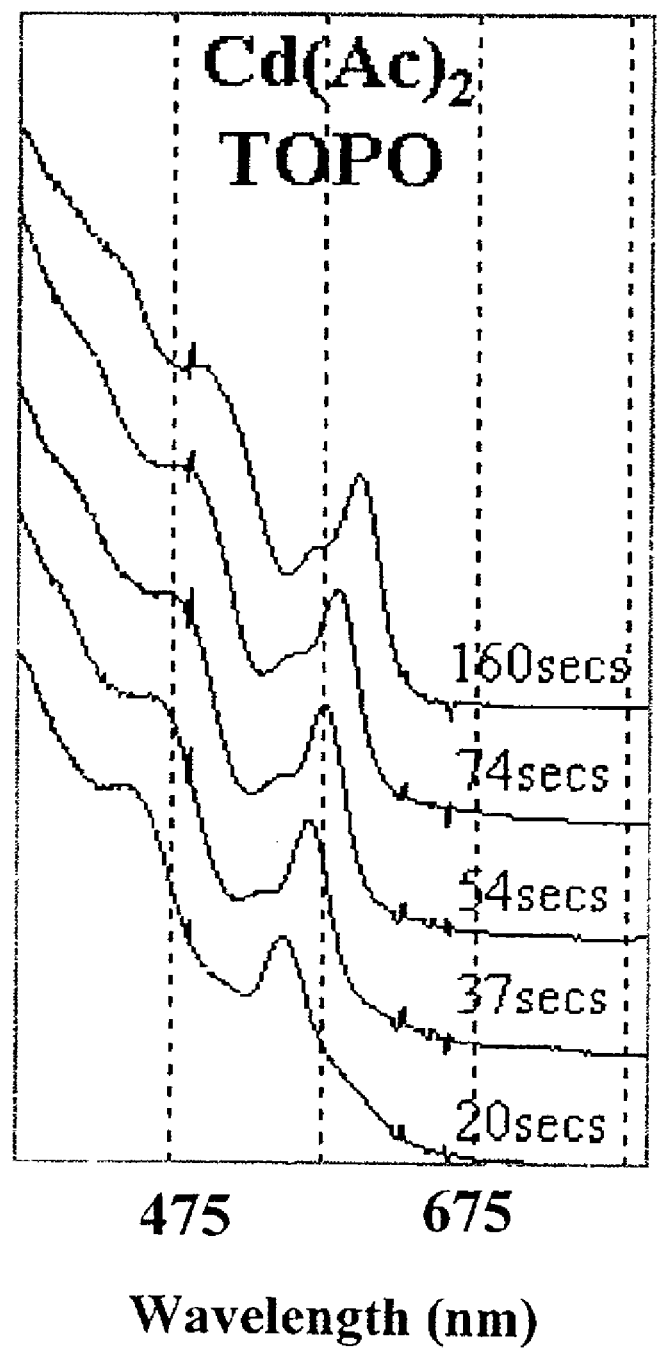
FIG. 7(a) is a graph illustrating the growth kinetics of CdSe nanocrystals utilizing Cd(Ac)$_2$ as the precursor and TOPO as the solvent.
Figure 7B:
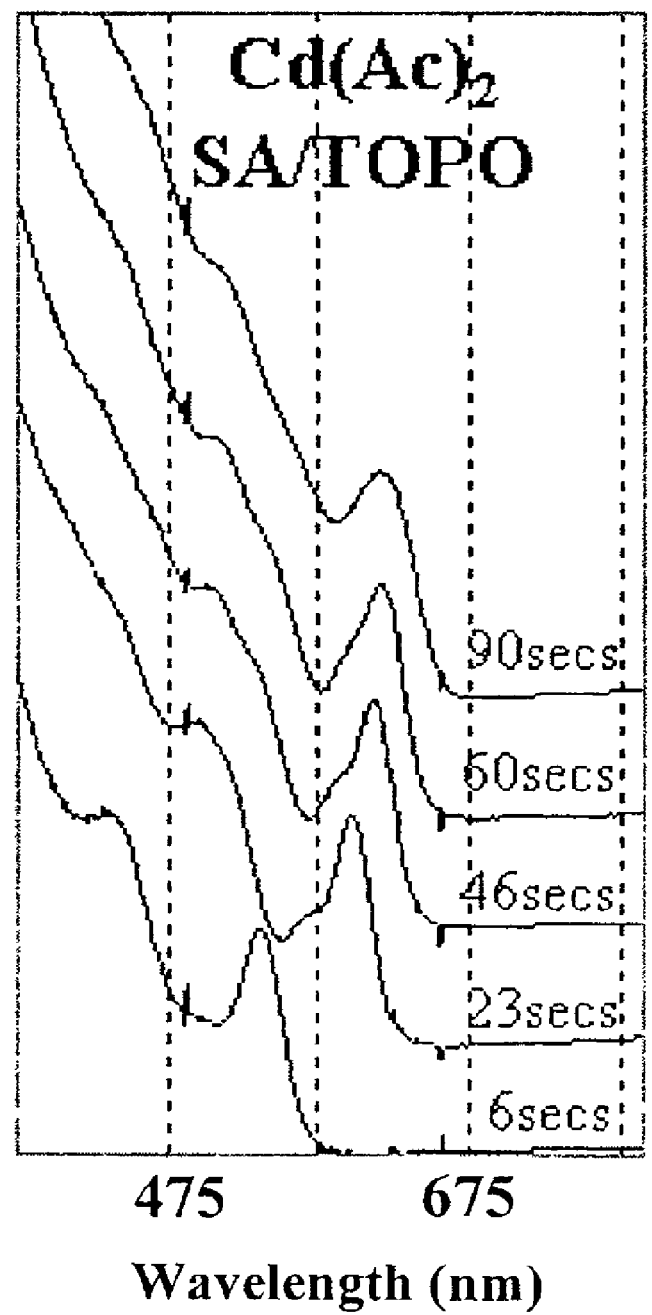
FIG. 7(b) is a graph illustrating the growth kinetics of CdSe nanocrystals utilizing Cd(Ac)$_2$ as the precursor, stearic acid (SA) as the ligand, and TOPO as the solvent.
Figure 7C:
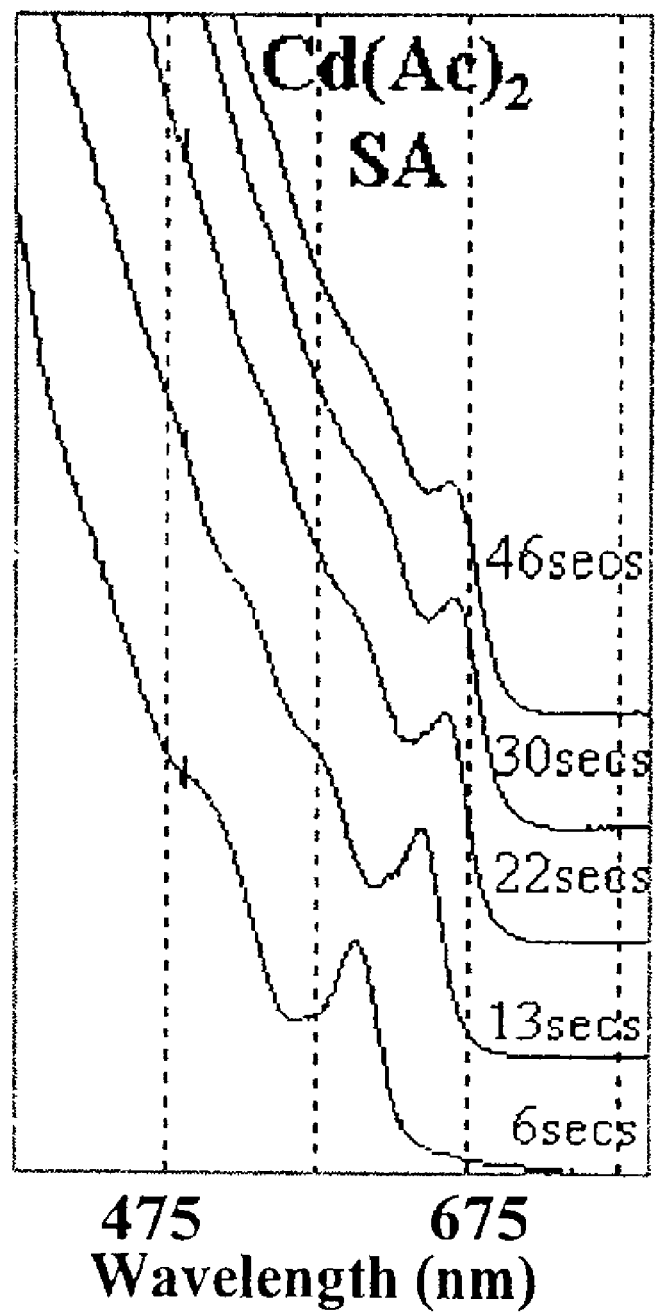
FIG. 7(c) is a graph illustrating the growth kinetics of CdSe nanocrystals utilizing Cd(Ac)$_2$ as the precursor and stearic acid (SA) as the ligand.
Figure 7D:
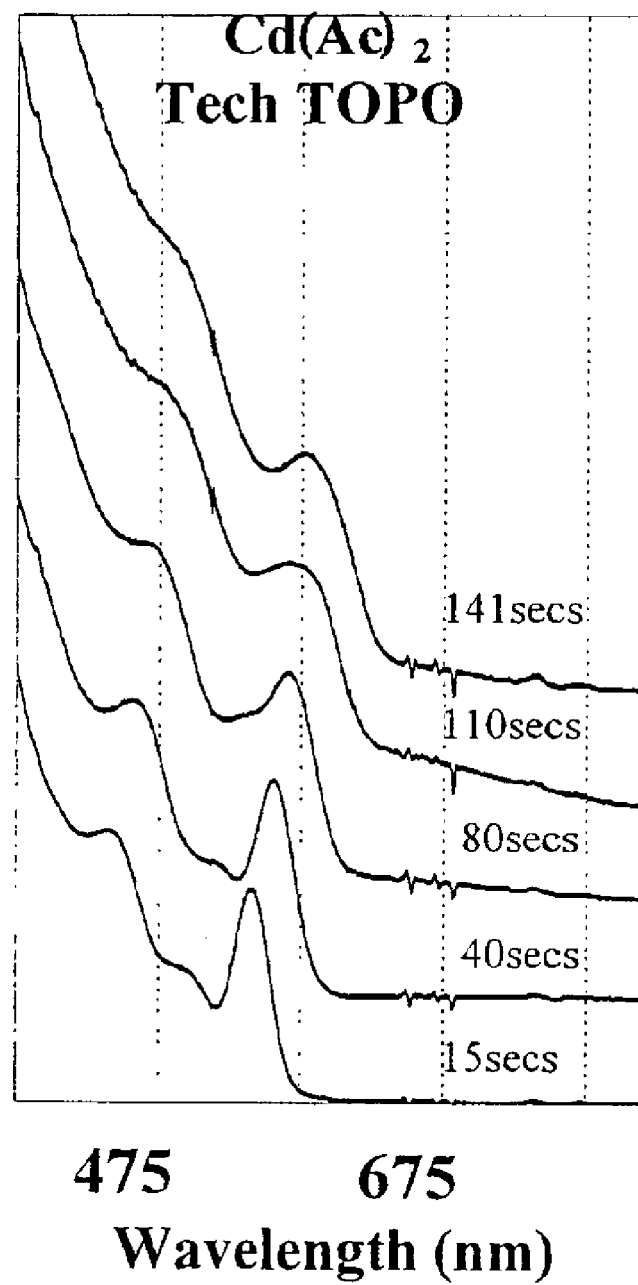
FIG. 7(d) is a graph illustrating the growth kinetics of CdSe nanocrystals utilizing Cd(Ac)$_2$ as the precursor and technical grade (Tech) TOPO as the solvent.
Figure 7E:
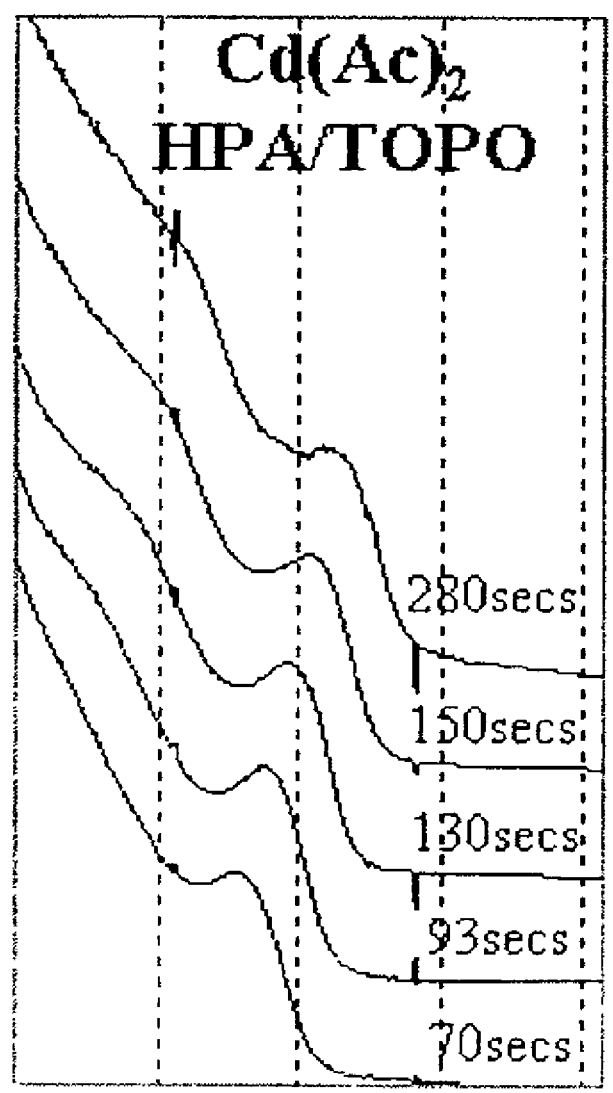
FIG. 7(e) is a graph illustrating the growth kinetics of CdSe nanocrystals utilizing Cd(Ac)$_2$ as the precursor, hexylphosphonic acid (HPA) as the ligand, and TOPO as the solvent.
Figure 7F:
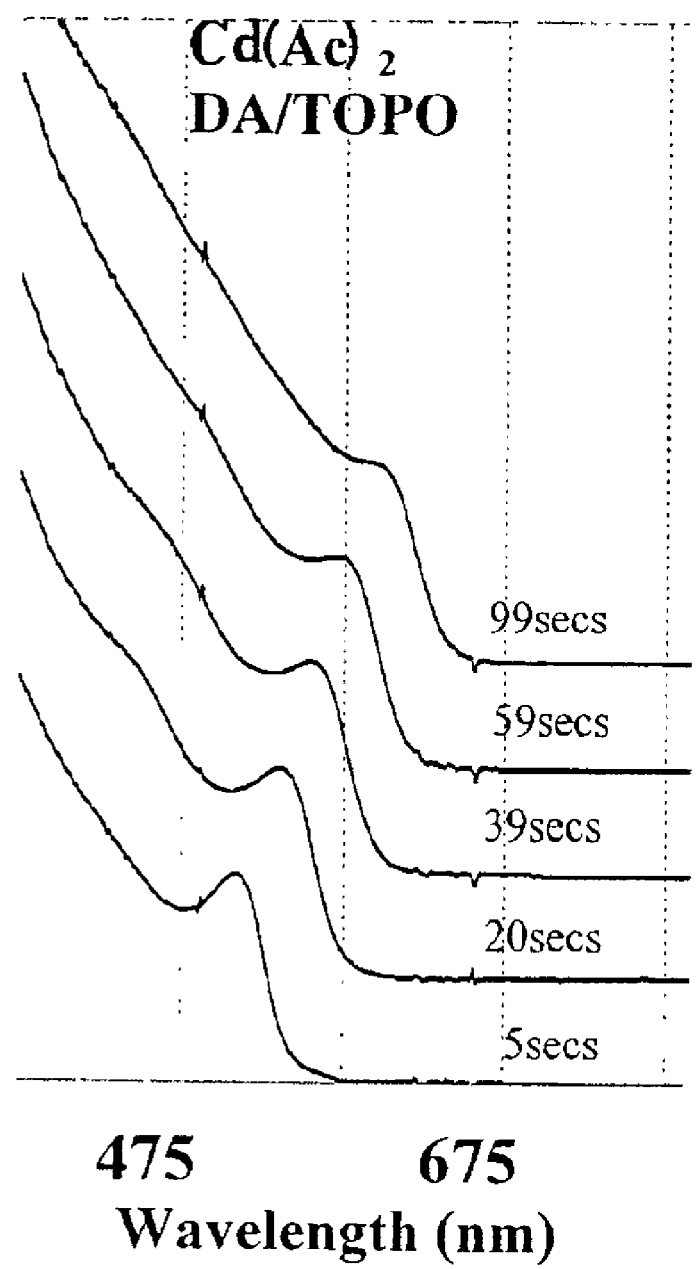
FIG. 7(f) is a graph illustrating the growth kinetics of CdSe nanocrystals utilizing Cd(Ac)$_2$ as the precursor, dodecylamine (DA) as the ligand, and TOPO as the solvent.
Figure 8A:
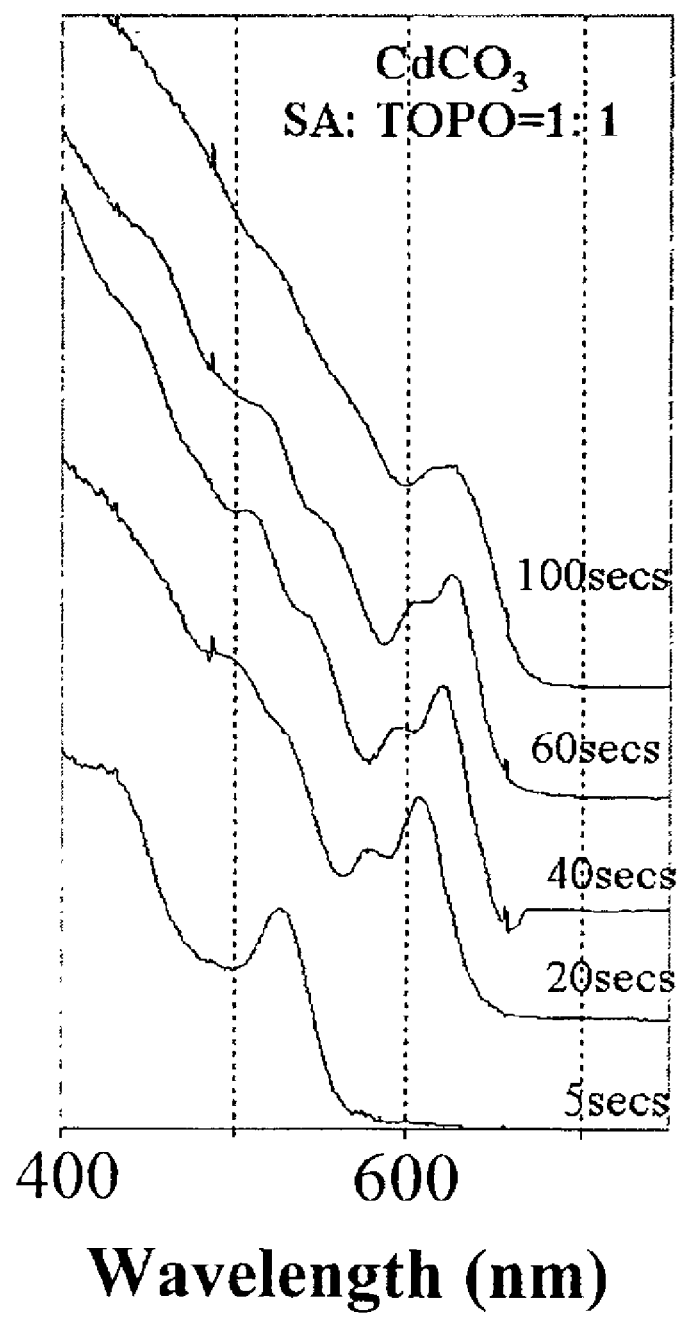
FIG. 8(a) is a graph illustrating the growth kinetics of CdSe nanocrystals using stearic acid as the ligand, TOPO as the solvent, and cadmium carbonate (CdCO$_3$) as the precursor.
Figure 8B:
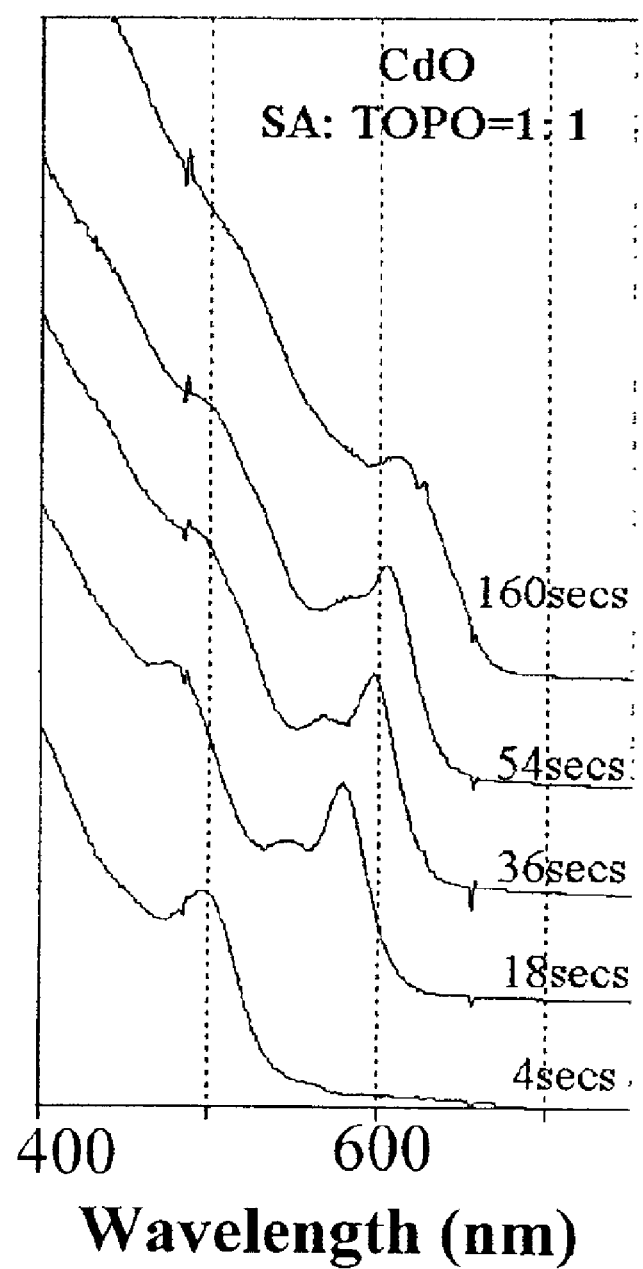
FIG. 8(b) is a graph illustrating the growth kinetics of CdSe nanocrystals using stearic acid as the ligand, TOPO as the solvent, and cadmium oxide (CdO) as the precursor.
Figure 8C:
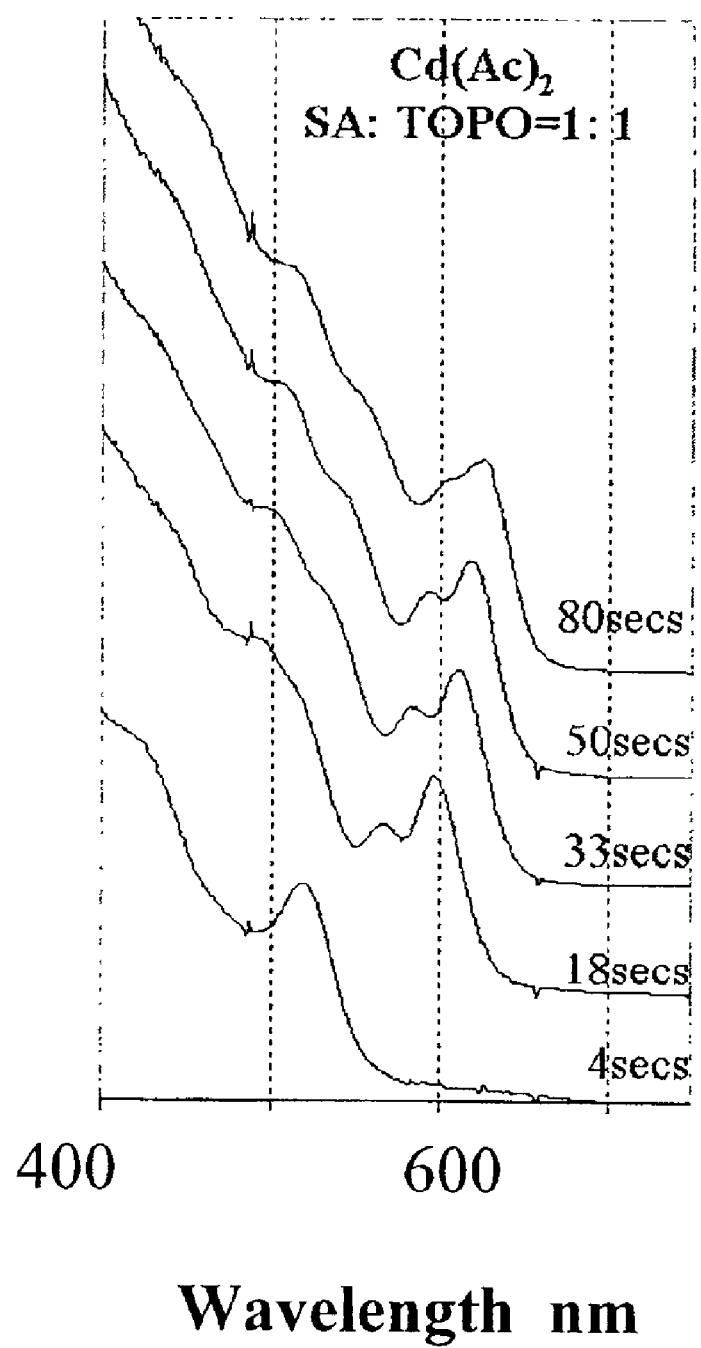
FIG. 8(c) is a graph illustrating the growth kinetics of CdSe nanocrystals using stearic acid as the ligand, TOPO as the solvent, and cadmium acetate (Cd(Ac)$_2$) as the precursor.
Figure 9:
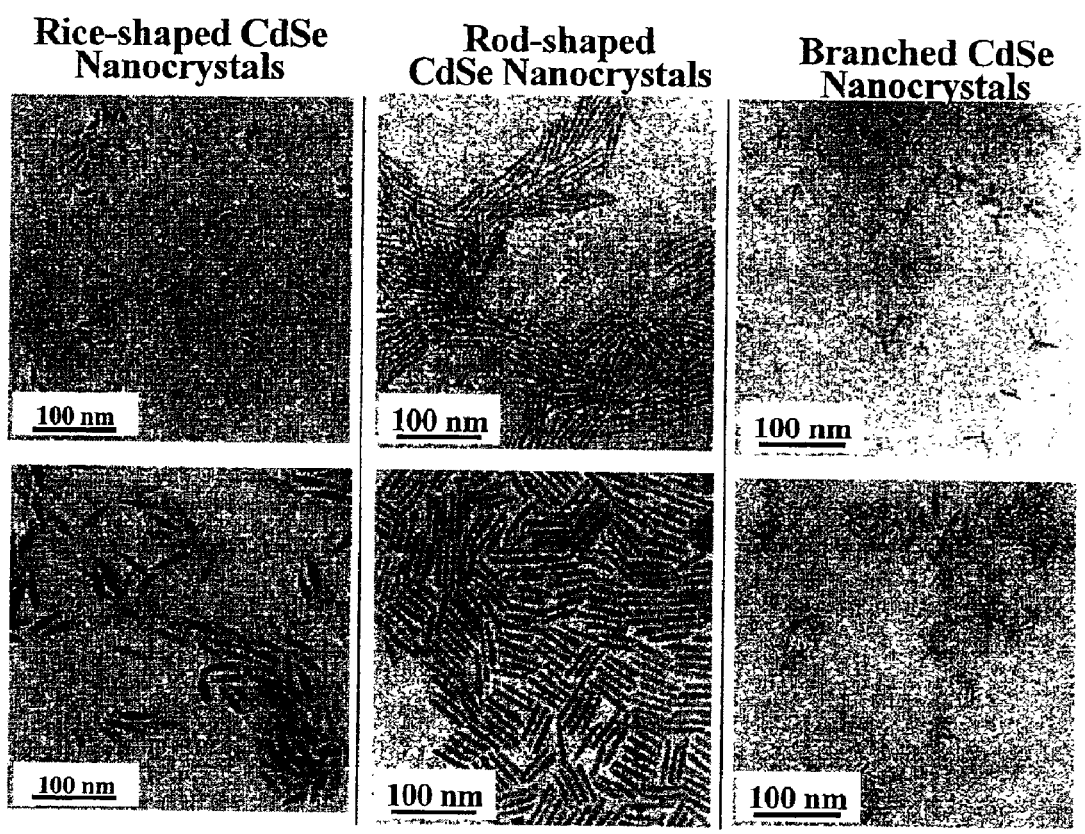
FIG. 9 is a transmission electron micrograph of the different shapes of CdSe nanocrystals using Cd-TDPA or Cd-ODPA.

The size range of close to monodisperse CdSe dots (FIGS. 5 and 6(*a*–*g*)) covers a range from approximately 1.5 nm to over 25 nm. By comparison, with the current $Cd(CH_3)_2$ method, the dot-shaped CdSe dots larger than approximately 5 nm are very difficult to generate. For the $Cd(CH_3)_2$ method, even with the aid of size selective precipitation, the largest sized CdSe dots with good size distribution as disclosed in the scientific literature are about 12 nm [Murray et al., *Journal of the American Chemical Society*, (1093), 115, 8706–8715].

Figure 2:
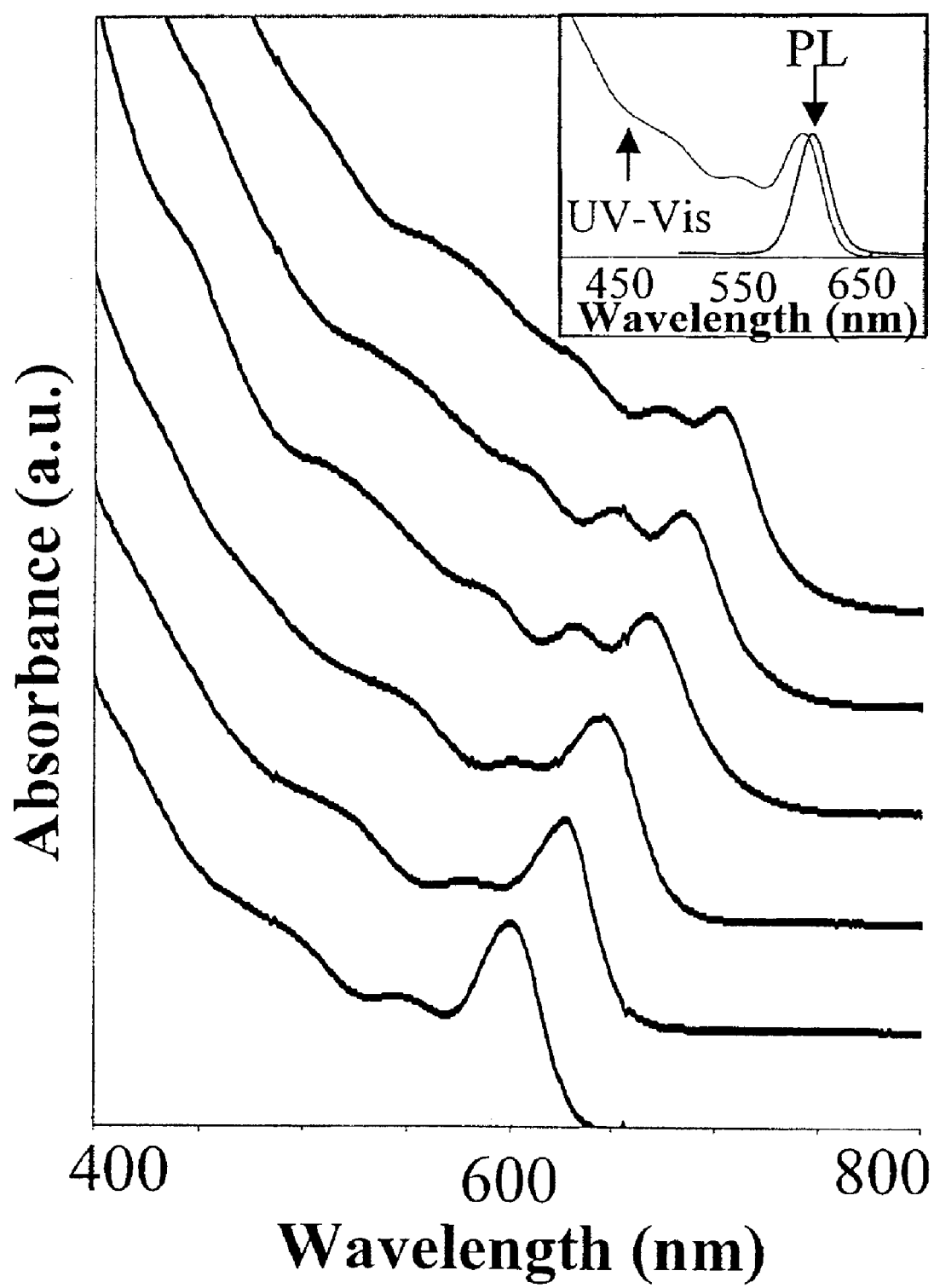
FIG. 2 is a graph of the absorption spectra of different sized CdTe nanocrystals ranging from 2–10 nm as quantified by UV-Vis absorption. Inset: photoluminescence (PL) and absorption of a CdTe nanocrystal sample.
Figure 3A:
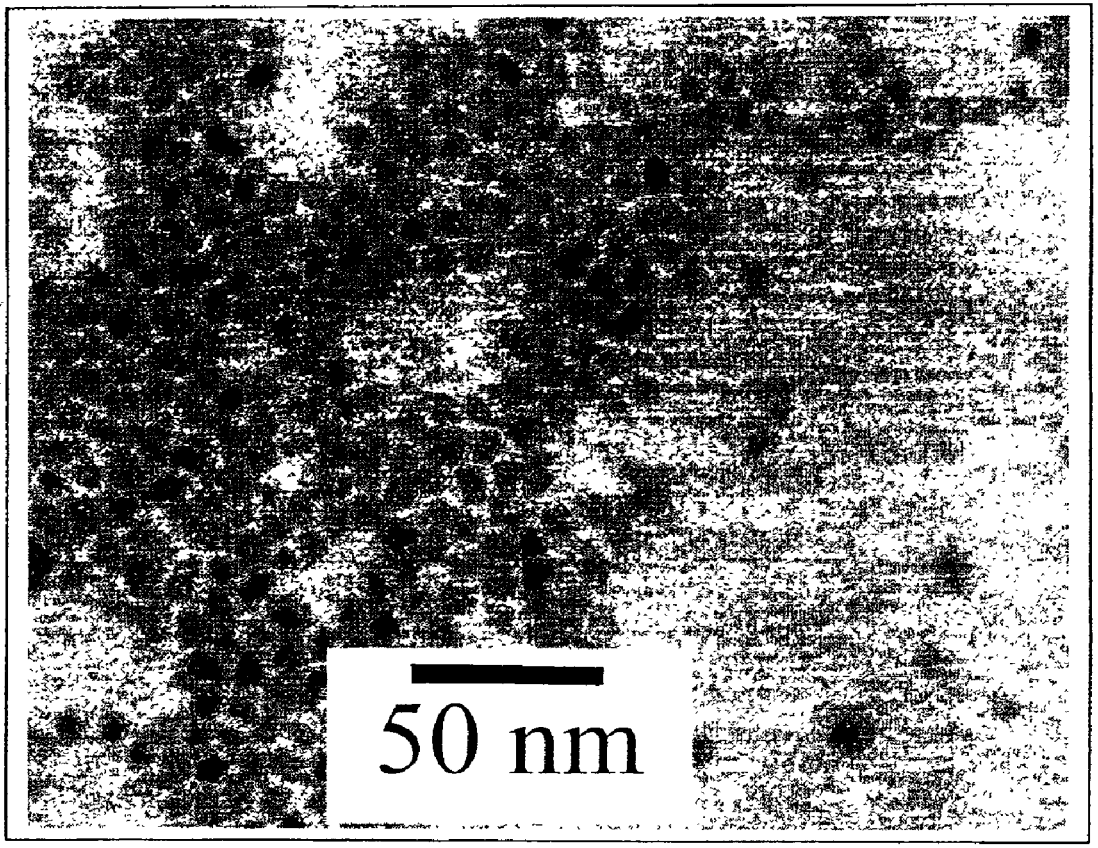
FIG. 3(a) is a transmission electron micrograph of CdTe quantum dots synthesized using the method of the present invention with CdO as the cationic precursor.
Figure 3B:
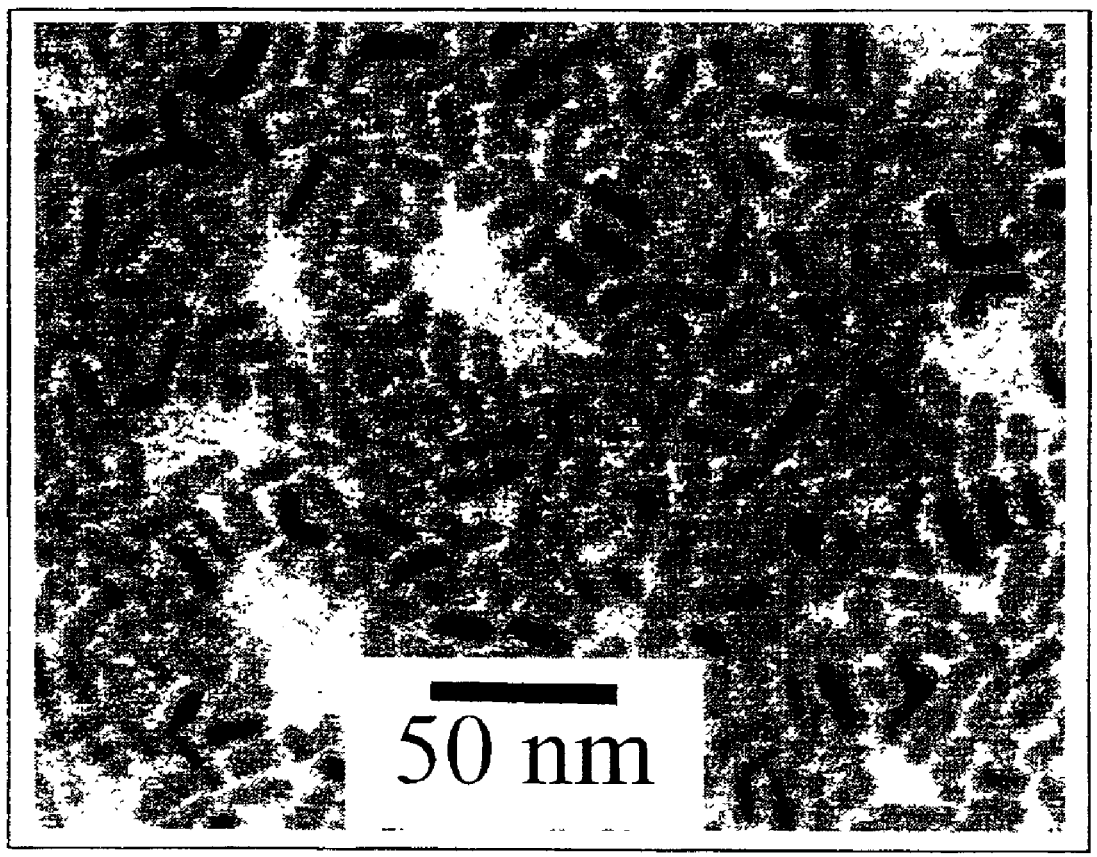
FIG. 3(b) is a transmission electron micrograph of CdTe quantum rods synthesized using the method of the present invention with CdO as the cationic precursor.

By using CdO as the precursor, different sized CdTe quantum dots can be synthesized. This is represented by the different absorption spectra that are shown in FIG. 2. Transmission electron microscopy (TEM) measurements indicate that these nanocrystals have a very narrow size distribution as shown in FIGS. 3(*a*) and 3(*b*). The relative standard deviation for these nanocrystals is approximately 10%.

As shown in FIGS. 1(*a*–*c*), 2, 5, 6(*a*–*g*), and 7(*a*–*f*), varying the growth conditions and the cadmium precursors can easily control the size of the nanocrystals. The initial size of the nanocrystals as well as their focusing size depend strongly on the initial monomer concentration, the ratio of cationic and anionic precursors, reaction temperatures, and the duration of the reaction.

X-ray powder diffraction indicates that in most cases, CdTe, CdSe, and CdS nanocrystals are highly crystalline wurtzite nanocrystals (see FIG. 6(*h*)). However, if amines are used as the ligands, CdSe nanocrystals seem to form zinc blend crystals.

Figure 4:
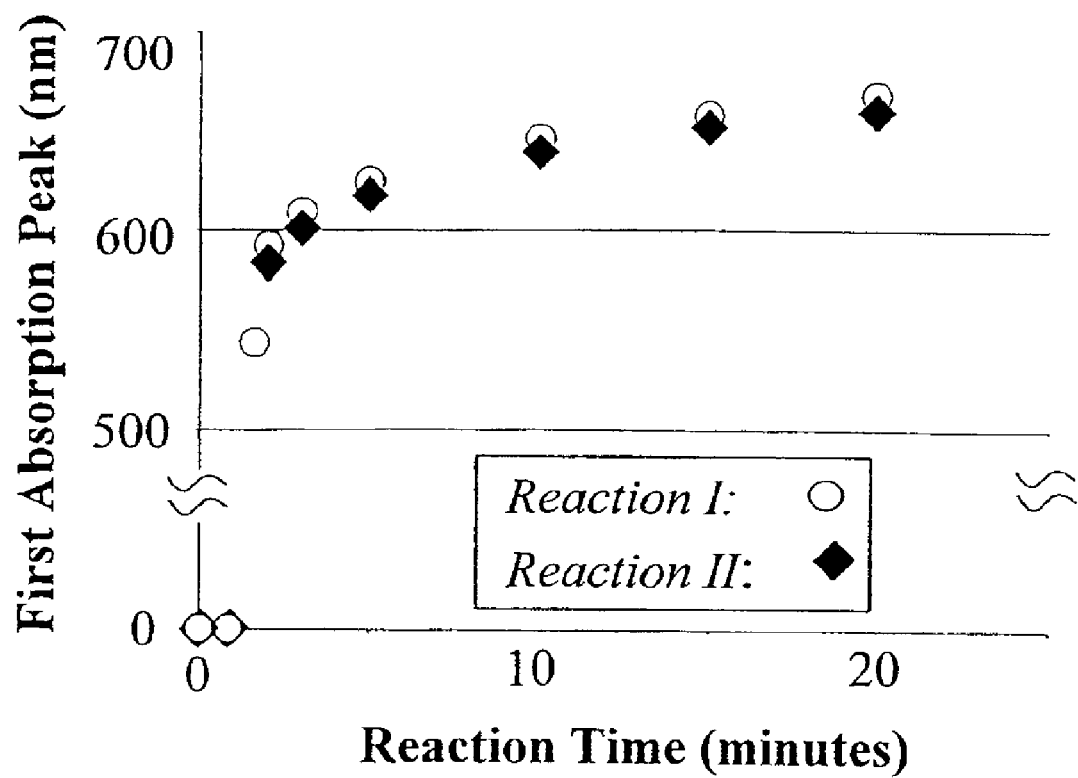
FIG. 4 is a graph illustrating the reproducibility of synthesizing CdTe nanocrystals using CdO as the precursor. Data points are within experimental error.

When using phosphonic acids as the ligand, the initial nucleation can be tuned tenths of seconds later after the injection. This is shown in FIG. 4. It is believed that the slow initial nucleation is due to the stability of Cd-HPA/Cd-TDPA complex. When $Cd(CH_3)_2$ is used as the precursor, it is believed that the instant initial nucleation is due to the extremely high reactivity of $Cd(CH_3)_2$.

The slow initial nucleation rate bears three important advantages in practice. First, the injection temperature does not need to be 350–360° C., but can be around 250–300° C. Second, both nucleation and growth of nanocrystals are not dependent on the initial injection. As a result, the synthesis is very reproducible (see FIG. 4 as an example). Third, the time delay of initial nucleation implies that the initial injection process can take as long as tenths of seconds.

In order to take the advantage of the "focusing of size distribution" and the "1D-growth" when using $Cd(CH_3)_2$ as the precursor, the Se dissolved in TBP injection had to be performed within sub-seconds at a temperature range of 340–360° C. The concept of the "1D-growth" refers to a specific growth stage in which all nanocrystals are growing only along one dimension, which is the unique axis of the crystal structure [Z. A. Peng and X. Peng, *Journal of the American Chemical Society*, 2001, in press]. Therefore, if $Cd(CH_3)_2$ is used as the precursor and if the injection volume is more than approximately 5–6 ml, the operation requires special caution and is very dangerous.

With the present invention, a large quantity of an elemental chalcogenic precursor (such as Se, Te, or S) solution can be added into the reaction vessel, provided that non-pyrophoric and non-explosive reactants are used. When approximately 5–20 ml of an elemental chalcogenic precursor stock solution was added to a 100 ml flask, the reaction yielded approximately 700 mg of high-quality CdTe nanocrystals. In addition, because the injection temperature of the elemental chalcogenic precursor in TBP, TOP, or an amine solvent can be as low as 150–300° C., the explosive nature is further reduced.

Currently, CdTe, CdSe, and CdS nanocrystals are of great industrial interest for developing photoluminescence-based biomedical labeling reagents. The photoluminescence properties of the nanocrystals synthesized by this CdO approach are comparable to the nanocrystals synthesized with $Cd(CH_3)_2$ precursors. FIG. 2 (inset) illustrates the absorption and emission spectra of a CdTe sample. In general, the photoluminescence of CdTe nanocrystals synthesized by the new method of the present invention is well above 20%. The photoluminescence properties of the nanocrystals synthesized by using carboxylic acids are significantly better than any existing methods. For instance, the photoluminescence quantum efficiency, as defined by the number of photons released by the number of photons absorbed, of CdSe nanocrystals synthesized in stearic acid is as high as 20–30%.

The CdO approach is well suitable for studying growth mechanisms of colloidal nanocrystals especially for nucleation for several reasons. First, in contrast to the $Cd(CH_3)_2$ related synthesis, the cadmium precursor in the entire nucleation and growth period is one species, Cd-HPA or Cd-TDPA. Second, the initial nucleation is reasonably slow, which makes it possible to access the nucleation process with better accuracy. Also, due to the slow nucleation and growth rate, time-resolved, in-situ study of crystallization is possible.

In conclusion, a reproducible method of synthesizing high-quality quantum rods and dots was developed using common metal oxides and metal salts as the cationic precursor. The cost of chemicals and equipment is considerably less than the existing $Cd(CH_3)_2$ approach. The resulting nanocrystals are nearly monodisperse without any size separation. The size range of close to monodisperse CdSe quantum dots achieved by the present invention is about four times larger than that achieved with the current synthetic methods, which utilize $Cd(CH_3)_2$ as the cadmium precursor. For CdTe nanocrystals, the size distribution is better than that reported for any CdTe nanocrystals. The shape of the nanocrystals synthesized by the present invention can be controllably varied between dots and rods. The crystal structure of CdSe nanocrystals can be between wurtzite and zinc blend types.

Overall, the reaction conditions of the present invention are very mild and simple as compared to the current $Cd(CH_3)_2$ approach. In principle, large-scale synthesis of high-quality colloidal nanocrystals can be achieved without using a glovebox. The present synthetic method is a major step towards a green chemistry approach for synthesizing high-quality semiconductor nanocrystals. This new approach may also be used for time-resolved, in-situ study of crystallization. Furthermore, the present method suggests that spontaneous formation of shape controlled high-quality colloidal nanocrystals under mild conditions is possible.

The following examples illustrate the method of the present invention with cadmium chalcogenides nanocrystals as well as other types of semiconductor nanocrystals. The reaction conditions of the following examples can be varied over a wide range. Using the synthesis of CdSe nanocrystals as an example, the conditions can be altered as follows. The cadmium precursor can be cadmium phosphonic acid complexes, cadmium fatty acids, CdO, CdCO3, Cd metal, or any other inexpensive and safe cadmium compound. The selenium precursor can be selected from different types of selenium-phosphine compounds. The temperature of the synthesis varies between 150 and 380° C. The concentration of the cadmium precursor is in the range of about 0.005 mol/kg to about 0.8 mol/kg. The cadmium precursor to selenium precursor ratio varies between approximately 1:5 and about 5:1.

EXAMPLE 1

CdTe Quantum Dots

CdTe quantum dots were synthesized by loading 0.0514 g (0.4 mmol) CdO, 0.2232 g (0.8 mmol) TDPA, and 3.78 g TOPO into a 25-ml flask and then heated to 300–320° C. under an Argon flow to dissolve the CdO. The mixture was maintained at 320° C. for 10 to 15 minutes in order to obtain an optically clear, colorless solution. This solution was then heated to 360° C. In a glove box, 0.0664 g Te powder was dissolved in TBP-toluene (1.8 g/0.2 g) to obtain a solution, which was then injected into the above reaction flask at 360° C. After injection, the nanocrystals grew at 250° C. Nanocrystal growth was monitored by removing aliquots for UV-Vis measurements. After the nanocrystals reached the desired size, the heating mantle was removed quickly and the reaction solvent was cooled down to stop the reaction. After the temperature of the solution was below 80° C., the nanocrystals were precipitated from the reaction mixture by adding approximately 10 ml methanol. The nanocrystal precipitate was separated by centrifugation and decantation. Nanocrystals were either stored as precipitate or dried in a vacuum (see the CdTe UV-Vis spectra in FIGS. 1(a) and 2 and the TEM picture for CdTe quantum dots in FIG. 3(a)).

EXAMPLE 2

CdTe Quantum Rods

CdTe quantum rods were synthesized by dissolving 0.1542 g (1.2 mmol) CdO in 0.6696 g (2.4 mmol) TDPA mixed with 3.55 g TOPO at 300° C. The optically clear solution was then heated to 360° C. Next, 0.2 g Te powder was dissolved in 1.8 g TBP, injected into the reaction flask at 360° C., and subsequently cooled to 250° C. to allow the quantum rods to grow. The reaction was monitored by UV-Vis spectra and then characterized by photo-luminescence spectra and TEM. After reaching the desired size, the heating mantle was removed quickly and the reaction solvent was cooled down to stop the reaction. After the temperature of the solution was below 80° C., the nanocrystals were precipitated from the reaction mixture by adding approximately 10 ml methanol. The nanocrystal precipitate was separated by centrifugation and decantation. Nanocrystals were either stored as precipitate or dried in a vacuum (see the quantum rods TEM picture in FIG. 3(b) as one sample).

EXAMPLE 3

Synthesis of CdSe Nanocrystals in CdO/TDPA/TOPO System

Initially, 0.0899 g (0.7 mmol) CdO, 0.4010 g (1.4 mmol) TDPA, and 3.78 g TOPO were loaded into a 25-mil flask and then heated to 300–320° C. under an Argon flow to dissolve the CdO. The mixture was maintained at 320° C. for 10 to 15 minutes in order to obtain an optically clear, colorless solution. This solution was then heated to 360° C. In a glove box, 0.0719 g (0.91 mmol) Se powder was dissolved in 2 g TBP to obtain a solution. This solution was then injected into the above reaction flask at 360° C. After injection, the temperature of the reaction solution was quickly cooled down to 250° C. for nanocrystals growth. Aliquots were used to monitor the reaction by UV-Vis measurement. After reaching the desired size, the heating mantle was removed quickly and the reaction solvent was cooled down to stop the reaction. When the temperature of the solution was below 80° C., the nanocrystals were precipitated from the reaction mixture by adding about 10 ml methanol. The nanocrystal precipitate was separated by centrifugation and decantation. Nanocrystals were either stored as precipitate or dried in a vacuum. Photo-luminescence spectra and TEM were used to characterize the samples (see the CdSe UV-Vis spectra in FIG. 1(b)).

EXAMPLE 4

Synthesis of CdSe Nanocrystals in CdO/SA (Stearic Acid) System

First, 0.0512 g CdO (about 0.4 mmol) and 4.027 g stearic acid were loaded into a 25-ml flask and heated up to 150° C. for 5 to 10 minutes to dissolve all CdO into stearic acid. This optically clear solution was then heated to 360° C. Then, 0.05 g Se (about 0.63 mmol) was dissolved in TBP-toluene (1.75 g/0.2 g) to obtain a solution, which was injected into the above reaction flask at 360° C. The reaction mixture was then cooled down to 250° C. for nanocrystal growth. After the nanocrystals reached the desired size, the heating mantle was quickly removed and the reaction solvent was cooled to stop the reaction. When the temperature of the solution was below 80° C., the nanocrystals were precipitated from the reaction mixture by adding about 20 ml acetone. The nanocrystal precipitate was separated by centrifugation and decantation. Nanocrystals were either stored as precipitate or dried in a vacuum.

EXAMPLE 5

Synthesis of CdSe Nanocrystals in $Cd(Ac)_2$/SA System

First, 0.2 mmol $Cd(Ac)_2$ was dissolved in 4 g stearic acid at approximately 100–150° C., with subsequent heating of the solution to 360° C. Then, 2 g TOP, 1.0 mmol Se, and 0.2 g toluene were combined to form a solution, which was subsequently injected at 360° C. After injection, the reaction solution was allowed to cool down to 250° C. for nanocrystal growth. After the nanocrystals reached the desired size, the heating mantle was quickly removed, and the reaction solvent was cooled to stop the reaction. When the temperature of the solution was below 80° C., the nanocrystals were precipitated from the reaction mixture by adding about 10 ml acetone. The nanocrystal precipitate was separated by centrifugation and decantation. Nanocrystals were either stored as precipitate or dried in a vacuum (see the UV-Vis spectra in FIG. 7(b)).

EXAMPLE 6

Low Temperature Synthesis

First, 0.4 mmol CdO, 0.8 mmol HPA, and 3.83 g TOPO were loaded into a reaction flask and heated to 320° C. to obtain a clear solution, then cooled to 200° C. Next, 0.31 mmol Se powder was dissolved in 2 g TBP to obtain a solution. The solution was then injected into the flask. Nanocrystals were grown at 170° C. after injection. After the nanocrystals reached the desired size, the heating mantle was quickly removed and the reaction solvent was cooled down to stop the reaction. When the temperature of the solution was below 80° C., the nanocrystals were precipitated from the reaction mixture by adding about 10 ml methanol. The precipitate was separated by centrifugation and decantation. Nanocrystals were either stored as precipitate or dried in a vacuum.

EXAMPLE 7

Synthesis of CdSe Nanocrystals Using $CdCl_2$

The synthesis of CdSe nanocrystals using $CdCl_2$ and HPA is different from the above reactions in that the Cd-HPA complex must first be isolated and purified to remove all the chloride ions. The $CdCl_2$ precursor was dissolved in water and subsequently precipitated using $NH_3H_2O$. This precipitate was centrifuged and separated from the liquid. The pellet was washed with distilled water and centrifuged again. This process was repeated three times to remove all the $Cl^-$ ions absorbed in the solid. The final pellet is purified $Cd(OH)_2 x\ H_2O$. The $Cd(OH)_2 x\ H_2O$ was then dissolved in a mixture of HPA and TOPO with the Cd/HPA ratio of 1:2 at 120–150° C. This solution was cooled down to 50–80° C. Methanol was added into the flask to completely precipitate the Cd-HPA complex. The Cd-HPA complex was separated from the liquid and dried.

Upon purification, the Cd-HPA complex (1 mmol) was mixed with 3.7 g TOPO and subsequently heated to 360° C. Two grams of Se (1.3 mmol Se dissolved in TBP) was then injected into the flask at 360° C. After injection, the reaction was cooled to 250° C. in order to allow the nanocrystals to grow. After reaching the desired size, the heating mantle was quickly removed and the reaction solvent was cooled down to stop the reaction. When the temperature of the solution reached below 80° C., the nanocrystals were precipitated from the reaction mixture by adding approximately 10 ml methanol. The precipitate was separated by centrifugation and decantation. After purification, the nanocrystals can be stored in a powder form or directly in the non-polar solvent.

EXAMPLE 8

Synthesis of CdSe Nanocrystals in $Cd(Ac)_2$/dodecylamine System

First, 0.2 mmol of $Cd(Ac)_2$ was dissolved in a mixture of 2 g dodecylamine and 2 g of TOPO at approximately 100° C. The mixture was heated to 250° C. Then, 1.0 mmol Se dissolved in 2 g TOP and 0.2 g toluene to form a solution, which was subsequently injected into the flask. The nanocrystals were allowed to grow at 230° C. to the desired size. After reaching the desired size, the heating mantle was quickly removed and the reaction solvent was cooled down to stop the reaction. When the temperature of the solution was below 80° C., the nanocrystals were precipitated from the reaction mixture by adding approximately 10 ml methanol. The precipitate was separated by I centrifugation and decantation. Nanocrystals were either stored as precipitate or were dried in a vacuum.

EXAMPLE 9

Synthesis of CdSe Nanocrystals in $Cd(Ac)_2$/Pure TOPO (99%)

First, 0.2 mmol of $Cd(Ac)_2$ was dissolved in 4 g of TOPO. The mixture was heated to 360° C., and 1.0 mmol Se dissolved in 2 g TOP and 0.2 g toluene was injected. The nanocrystals were allowed to grow at 250° C. to the desired size. After the nanocrystals reached the desired size, the heating mantle was quickly removed and the reaction solvent was cooled down to stop the reaction. When the temperature of the solution was below 80° C., the nanocrystals were precipitated from the reaction mixture by adding approximately 10 ml methanol. The precipitate was separated by centrifugation and decantation. Nanocrystals were either stored as precipitate or dried in a vacuum (see the UV-Vis spectra presented in FIG. 7(a)).

EXAMPLE 10

Synthesis of CdSe Nanocrystals in $CdCO_3$/SA/TOPO System

CdSe nanocrystals were synthesized by dissolving 0.2 mmol $CdCO_3$ in a mixture of 2 g stearic acid and 2 g TOPO at approximately 100–150° C. This solution was then hated to 360° C. 1.0 mmol Se was dissolved in 2 g TOP and 0.2 g toluene to form a solution. This solution was injected at 360° C. into the flask. The reaction mixture was cooled to 250° C. for nanocrystal growth. After the nanocrystals reached the desired size, the heating mantle was quickly removed and the reaction solvent was cooled down to stop the reaction. When the temperature of the solution was below 80° C., the nanocrystals were precipitated from the reaction mixture by adding approximately 10 ml methanol. The precipitate was separated by centrifugation and decantation. Nanocrystals were either stored as precipitate or dried in a vacuum (see FIG. 8(a)).

EXAMPLE 11

CdS Nanocrystals

First, 0.4 mmol (0.0514 g) CdO, 0.8 mmol (about 0.2232 g) TDPA, 3.78 g TOPO were mixed in a reaction flask and heated to 300° C. for 5 to 10 minutes. After an optically clear solution was obtained, the solution was then cooled down to 270° C. for injection under argon flow. In a glove box, 3.2 mg(0.2 mmol) sulfur was dissolved in 2 g benzylamine to obtain a sulfur solution. At 270° C., this solution was injected into the reaction flask and the nanocrystals were grown at 220° C. After the nanocrystals reached the desired size, the heating mantle was quickly removed and the reaction solvent was cooled down to stop the reaction. When the temperature of the solution reached below 80° C., the nanocrystals were precipitated from the reaction mixture by adding approximately 10 ml methanol. The precipitate was separated by centrifugation and decantation. Nanocrystals were either stored as precipitate or dried in a vacuum (see the CdS UV-vis spectra in FIG. 1(c)).

EXAMPLE 12

InP Nanocrystals

Indium phosphate (InP) nanocrystals were synthesized by dissolving 0.1 mmol (0.02 g) fresh $In(OH)_3$ in 3 mmol (0.5 g) HPA and 3.5 g TOPO at approximately 200° C. under argon flow. Then the solution was cooled to 120–130° C. and the reaction system was flushed with argon, vacuum pumped for 20–30 minutes, followed by another argon flow for 10–15 minutes. The process of argon flow and vacuum pumping was repeated for three times in order to remove all the absorbed water and oxygen in the reaction system. The reaction mixture was heated to 300° C. with a subsequent injection of a 2 g stock solution which contained 0.0277 g (0.1 mmol) P(TMS)$_3$, 1.8 g TOP, and 0.2 g toluene. The reaction mixture was cooled to 250° C. in order to allow the nanocrystals to grow. After the nanocrystals reached the desired size, the heating mantle was quickly removed and the reaction solvent was cooled down to stop the reaction. When the temperature of the solution was below 80° C., the nanocrystals were precipitated from the reaction mixture by adding approximately 10 ml methanol. The precipitate was separated by centrifugation and decantation. Nanocrystals were either stored as precipitate or dried in a vacuum. The size distribution of nanocrystals using this reaction is broad, producing a standard deviation of greater than 20%.

EXAMPLE 13

ZnSe Nanocrystals

ZnSe nanocrystals were synthesized by dissolving 0.4 mmol ZnO in a mixed solvent consisting of 2 g stearic acid and 2 g TOPO with subsequent heating to 340° C. After the ZnO was completely dissolved, the mixture was cooled to 280° C. Next, 0.3077 mmol Se dissolved in 2 g TBP was injected at 280° C. The reaction mixture was cooled to 250° C. for nanocrystals growth. After nanocrystals reached the desired size, the heating mantle was quickly removed and the reaction solvent was cooled down to stop the reaction. When the temperature of the solution was below 80° C., the nanocrystals were precipitated from the reaction mixture by adding approximately 10 ml methanol. The precipitate was separated by centrifugation and decantation. Nanocrystals were either stored as precipitate or dried in a vacuum. The size distribution of nanocrystals using this reaction is broad, producing a standard deviation of greater than 20%.

EXAMPLE 14

ZnS Nanocrystals

ZnS nanocrystals were synthesized by dissolving 0.4 mmol Zn(Ac) in a mixture solvent of 2 g stearic acid and 2 g TOPO with subsequent heating to 340° C. After the Zn(Ac) is completely dissolved, the solution was cooled to 280° C. Then, 0.8 mmol S dissolved in 2 g benzylamine was injected at 280° C. The reaction mixture was cooled to 250° C. in order to allow nanocrystals to grow. After the nanocrystals reached the desired size, the heating mantle was quickly removed and the reaction solvent was cooled down to stop the reaction. When the temperature of the solution was below 80° C., the nanocrystals were precipitated from the reaction mixture by adding approximately 10 ml methanol. The precipitate was separated by centrifugation and decantation. Nanocrystals were either stored as precipitate or dried in a vacuum. The size distribution of nanocrystals using this reaction is broad, producing a standard deviation of greater than 20%.

EXAMPLE 15

Synthesis of CdSe Rods

This example provides a two-step process by which nearly monodisperse CdSe rods were prepared.

A. Step 1—Preparation of Cd-TDPA/TOPO Complex—5 mmol CdO (0.6420 g), 10 mmol of TDPA (2.79 g), and 2 g TOPO (99%) were loaded into a reaction flask and heated up to 320° C. with stirring under argon flow. After an optically clear solution was obtained (i.e., essentially all the CdO was dissolved in the TDPA and TOPO mixture solvent), the heating was stopped, and the solution was allowed to cool to room temperature. A solid product, the Cd-TDPA/TOPO complex, was obtained. This solid product was taken out of the reaction flask and stored in a vial for the following CdSe rod synthesis.

B. Step 2—Synthesis of nearly Monodisperse CdSe rods—1.6 mmol Cd-TDPA/TOPO complex prepared above (1.72 g) and 2.28 g TOPO (99%) were loaded into a reaction flak and heated up to 320° C. with stirring and argon flow. In a glove box, 0.256 g Se:TBP solution (contains 0.064 g Se, 0.8 mmol) was mixed with 1.444 g TOP and 0.3 g anhydrous toluene to obtain an injection solution. This Se solution was transferred out from the glove box and loaded into a syringe, and then injected into the reaction flask at 320° C. The nanocrystals were allowed to grow at 250° C. and aliquots were taken out from flask to monitor the reaction by UV-vis, PL and TEM. After the nanocrystals grew to predetermined size, the reaction was stopped and the reaction mixture was allowed to cool to about 80° C., followed by addition of 20 ml methanol to precipitate the nanocrystals. TEM, UV-vis, PL results indicated that the obtained rods have a relatively uniform size distribution. A statistical analysis of a TEM image from rods taken in one aliquot at 45 minutes after injection showed that the average short axis was 6.18 nm with a standard deviation of 5.03% and the aspect ratio was 6.98 with a standard deviation of 11.51%.

EXAMPLE 16

Synthesis of CdSe Nanocrystals in Stearic Acid/ Hexadecylamine/TOPO

This example describes a procedure for preparing highly luminescent and essentially monodisperse CdSe nanocrystal dots in a three-component solvent system, steric acid/ hexadecylamine/TOPO solvent system.

CdO (0.2 mmol) and stearic acid (0.8 mmol) were loaded into a reaction flask an heated to about 150° C. with stirring and argon flow. The clear hot solution was cooled down to room temperature. Hexadecylamine and TOPO (1:1 in mass) were added into the flask and the final total mass was 4.0 grams. Consequently, the mixture was heated to 270° C. under argon flow. Se (1 mmol) was dissolved in 1.2 mmol TBP and diluted with dioctylamine to 2 grams total. The Se solution was quickly injected into the reaction flask at 270° C. The system was then set at 250° C. for growth of the CdSe nanocrystals to reach predetermined sizes. The nanocrystals were essentially monodisperse in the size range between 2 nm and 6 nm, typically with 5–10% standard derivation. The as-prepared nanocrystals also possess very high photoluminescence quantum efficiency.

EXAMPLE 17

Synthesis of CdSe Nanocrystals in Stearic Acid/ Octadecylamine/TOPO

This example describes a procedure for preparing highly luminescent and essentially monodisperse CdSe nanocrystal dots in a three-component solvent system, stearic acid/ octadecylamine/TOPO solvent system.

CdO (0.4 mmol) and SA (1.6 mmol) were loaded into a reaction flask and heated to about 150° C. with stirring and argon flow. The clear hot solution was cooled down to room temperature. Octadecylamine and TOPO (1:1 in mass) were added into the flask and the final total mass was 4.0 grams.

The mixture was heated to 270° C. under argon flow. Se (2 mmol) was dissolved in 2.4 mmol TBP and diluted by dioctylamine to 2 grams total. The Se solution was quickly injected into the reaction flask at 270° C. The system was then set at 250° C. for growth to reach different sized CdSe nanocrystals. The nanocrystals were essentially monodisperse in the size range between 2 nm to 6 nm and highly luminescent.

EXAMPLE 18

Synthesis of Cadmium-TDPA Complex 0.6420 g CdO (5 mmol), 2.7900 g TDPA (10 mmol), and 2 g TOPO were loaded into the reaction flask, then heated up under Argon flow. The CdO was dissolved into the solvent around 300° C. and an optical clear solution was obtained. After kept for 5 to 10 minutes, the solution was cooled down to room temperature under argon flow. A solid product was obtained and then removed from the reaction flask. This is the Cd-TDPA complex, which was used as the precursor for synthesis of CdSe nanocrystals.

EXAMPLE 19

Synthesis of Cadmium-ODPA (Octadecyl Phosphonic Acid) Complex 0.6420 g CdO (5 mmol), 3.3447 g ODPA (10 mmol), and 2.2 g TOPO were loaded into the reaction flask, then heated up under Argon flow. The CdO was dissolved into the solvent around 200° C. and an optical clear solution was obtained. After kept for 5 to 10 minutes, the solution was cooled down to room temperature under argon flow. A solid product was obtained and then removed from the reaction flask. This is the Cd-ODPA complex, which was used as the precursor for synthesis of CdSe nanocrystals.

EXAMPLE 20

Synthesis of Rice-Shaped CdSe Nanocrystals 1.3259 g Cd-TDPA complex (1.31 mmol) and 1.8204 g TOPO were loaded into the reaction flask, and then heated up to 350° C. under Argon flow. In the glove box, two kind of Se solutions were prepared separately. In one vial, 0.205 g Se-TBP (25% Se) solution (contains 0.655 mmol Se), 1.097 g TOP, and 0.228 g toluene were loaded and mixed together. This was named as Se solution 1. In another vial, 0.259 g Se (3.275 mmol) was mixed with 2.037 g TOP and 0.15 g toluene. This mixture was stirring until all the Se powder was dissolved in the solution and an optical solution was obtained. This solution was named as Se solution 2. Se solution 1 was loaded into a 5-ml syringe and then quickly injected into the reaction flask at 350° C. The temperature of reaction solution dropped quickly after the injection and then was kept at 300° C. for nanocrystals growth. Needle-tip aliquots were taken out to monitor the reaction at certainly reaction time. 0.6 ml Se solution 2 (one third of whole solution) was loaded into a 1-ml syringe and then introduced into the reaction solution at 300° C. with the dropwise rate of 1drop per second started around 4 minute after the first injection. After finished the slow injection, one needle tip aliquot was taken out and then another 0.6 ml Se solution 2 was added again with the same method. Another needle tip aliquot was taken out and then the left Se solution 2 was added into the reaction solution as descript above. After all the Se solution 2 was added into the reaction solution, the reaction was running until the nanocrystals were insoluble in hexanes. Finally, the heating mantle was removed and the temperature was cooled down. Around 80° C., 5 ml toluene and 10 ml methanol were added into the reaction flask to precipitate down the nanocrystals. The nanocrystal precipitate was separated by centrifugation and decantation and then nanocrystals were either stored as precipitate or dried in a vacuum.

EXAMPLE 21

Synthesis of CdSe Rods Using Cd-ODPA Complex 2 g Cd-ODPA complex (about 1.6 mmol) and 2 g TOPO were loaded in a 25-ml reaction flask and then heated up to 350° C. under Argon flow. In the glove box, 0.256 g Se-TBP solution (contains 25% Se, 0.8 mmol) was mixed with 1.444 g TOP and 0.3 g toluene as the Se solution. Then, this solution was injected into the reaction flask at 350° C., and the reaction was kept at 300° C. for nanocrystals growth. Aliquots were taken out to monitor the reaction at certainly period of time scale. The reaction was stopped around 1 hour by removing the heating mantle and cooling down the reaction solvent. 5 ml toluene and 10 ml methanol were added in the reaction flask around 80° C. to precipitate the nanocrystals.

The Cd-ODPA complex can be replaced by a Cd-TDPA complex or other Cd phosphonic acid complexes with the same number of moles of cadmium using the same reaction conditions and procedures to make the CdSe rods. The Cd-ODPA complex or the Cd-TDPA complex concentration ranges between 0.33 mol/kg and about 0.6 mol/kg.

The Cd precursor and the Se precursor are in the range between 5:1 and 1:5. The Se precursor, Se-TBP, can be replaced by Se-TOP or other Se phosphine compounds. The Cd precursor, Cd-ODPA, can be replaced by the Cd-TDPA complex or other Cd phosphonic acid complexes.

The reaction temperature can vary between approximately 250° and about 380° C. for the synthesis of the rod shaped CdSe nanocrystals.

EXAMPLE 22

Synthesis of Brached CdSe Nanocrystals 2 g Cd-ODPA complex (about 1.6 mmol) and 2 g TOPO were loaded in a 25-ml reaction flask and then heated up to 250° C. under Argon flow. In the glove box, 0.256 g Se-TBP solution (contains 25% Se, 0.8 mmol) was mixed with 1.444 g TOP and 0.3 g toluene as the Se solution. Then, this solution was injected into the reaction flask at 250° C. and the reaction was kept at 180° C. for nanocrystals growth. Aliquots were taken out to monitor the reaction at certainly period of time scale. The reaction was stopped around 24 hour by removing the heating mantle and cooling down the reaction solvent. 5 ml toluene and 10 ml methanol were added in the reaction flask around 80° C. to precipitate the nanocrystals.

All references referred to herein are hereby incorporated by reference in their entirety.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method of synthesizing colloidal nanocrystals, comprising the steps of:
   (a) combining a metal oxide or metal salt precursor, a ligand, and a coordinating solvent to form a metal complex, wherein the metal ion is selected from a group IV metal or a transition metal; and
   (b) admixing an elemental ehalcogeme precursor with the metal complex at a temperature sufficient to form rod-shaped, rice-shaped, or branched nanocrystals.

2. The method according to claim 1, wherein the transition metal ions include Cd, Zn, Hg, Cu, Ag, Ni, Co, Fe, Mn, Ti, and Zr.

3. The method according to claim 1, wherein the group IV metal ions include Sn and Pb.

4. The method according to claim 1, wherein the metal salt precursor is selected from the group consisting of metal halides, metal carboxylates, metal carbonates, and any other salt capable of dissolving in the ligand and coordinating solvent.

5. The method according to claim 1, wherein the ligand is selected from the group consisting of long-chain fatty amines, long-chain fatty acids, phosphonic acids, and phosphine oxides.

6. The method according to claim 5, wherein the ligand includes dodecylamine (DA), hexadecylamine (HA), octadecylamine (OA), stearic acid (SA), lauric acid (LA), hexylphosphonic acid (HPA), tetradecylphosphonic acid (TDPA), and trioctylphosphine oxide (TOPO).

7. The method according to claim 1, wherein the metal salt precursor is cadmium acetate.

8. The method according to claim 1, wherein the metal salt precursor is cadmium carbonate.

9. The method according to claim 1, wherein the metal oxide precursor is cadmium oxide.

10. The method according to claim 1, wherein the elemental chalcogenic precursor is selected from the group consisting of Se, Te, and S.

11. The method according to claim 1, wherein the coordinating solvent is a high-boiling point coordinating solvent having a boiling point range between about 100° to about 400° C.

12. The method according to claim 1, wherein the coordinating solvent is selected from the group consisting of long-chain fatty amines, long-chain fatty acids, phosphonic acids, and phosphine oxides.

13. The method according to claim 12, wherein the coordinating solvent includes dodecylamine (DA), hexadecylamine (HA), octadecylamine (OA), stearic acid (SA), lauric acid (LA), hexylphosphonic acid (HPA), tetradecylphosphonic acid (TDPA), and trioctylphosphine oxide (TOPO).

14. The method according to claim 1, wherein the formation of the nanocrystals may be pre-selected by varying the elemental chalcogenic precursor that is introduced into the metal complex at step (b).

15. The method according to claim 1, wherein CdSe nanocrystals are formed.

16. The method according to claim 1, wherein CdTe nanocrystals are formed.

17. The method according to claim 1, wherein CdS nanocrystals are formed.

18. The method according to claim 1, wherein the ligand and the coordinating solvent are the same chemical.

19. The method according to claim 1, wherein the nanocrystals that are formed exhibit high crystallinity, high monodispersity, and high reproducibility.

20. The method according to claim 1, wherein the nanocrystals that are formed are quantum rods.

21. The method according to claim 1, wherein steps (a) and (b) are carried out in a single reaction vessel.

22. A biological labeling reagent produced by the method according to claim 1.

23. An LED produced by the method according to claim 1.

24. A method of synthesizing high-quality cadmium nanocrystals, comprising the steps of:
   (a) combining a metal oxide precursor, a ligand, and a coordinating solvent to form a metal complex, wherein the metal oxide precursor is CdO; and
   (b) admixing an elemental chalcogenic precursor with the metal complex at a temperature sufficient to form cadmium nanocrystals.

25. The method of claim 24, wherein the ligand is selected from the group consisting of long-chain fatty amines, long-chain fatty acids, phosphonic acids, and phosphine oxides.

26. The method according to claim 25, wherein the ligand includes dodecylamine (DA), hexadecylamine (HA), octadecylamine (OA), stearic acid (SA), lauric acid (LA), hexylphosphonic acid (HPA), tetrad ecylphosphonic acid (TDPA), and trioctylphosphine oxide (TOPO).

27. The method according to claim 24, wherein the elemental chalcogenic precursor is selected from the group consisting of Se, Te, and S.

28. The method according to claim 24, wherein the coordinating solvent is a high-boiling-point coordinating solvent having a boiling point range between about 100° to about 400° C.

29. The method according to claim 24, wherein the coordinating solvent is selected from the group consisting of long-chain fatty amines, long-chain fatty acids, phosphonic acids, and phosphine oxides.

30. The method according to claim 29, wherein the coordinating solvent includes dodecylamine (DA), hexadecylamine (HA), octadecylamine (OA), stearic acid (SA), lauric acid (LA), hexylphosphonic acid (HPA), tetrad ecylphosphonic acid (TDPA), and trioctylphosphine oxide (TOPO).

31. The method according to claim 24, wherein CdTe nanocrystals are formed.

32. The method according to claim 24, wherein CdSe nanocrystals are formed.

33. The method according to claim 24, wherein the CdS nanocrystals are formed.

34. The method according to claim 24, wherein the ligand and the coordinating solvent are the same chemical.

35. The method according to claim 24, wherein the cadmium nanocrystals exhibit high crystallinity, high monodispersity, and high reproducibility.

36. The method according to claim 24, wherein the cadmium nanocrystals are quantum dots or quantum rods.

37. The method according to claim 36, wherein the size range of close to monodisperse CdSe dots ranges from approximately 1.5 nm to greater than 25 nm.

38. The method according to claim 24, wherein steps (a) and (b) are carried out in a single reaction vessel.

39. A biological labeling reagent produced by the method according to claim 24.

40. An LED produced by the method according to claim 24.

41. A method of synthesizing CdSe rods, comprising the steps of:
   (a) combining a cadmium precursor and a coordinating solvent to form a solution upon heating; wherein the cadmium precursor is selected from the group consisting of Cd-ODPA complex, Cd-TDPA complex, and any other Cd phosphonic complex; and (b) admixing an elemental chalcogenic precursor with the solution at a temperature sufficient to form CdSe rods, wherein the chalcogenic precursor is selected from the group consisting of Se-TBP, Se-TOP, and any other Se phosphine compound.

42. The method according to claim 41, wherein the coordinating solvent is a phosphine oxide.

43. The method according to claim 42, wherein the phosphine oxide is selected from the group consisting of trioctylphosphine oxide (TOPO) and tributylphosphine oxide (TBPO).

44. The method according to claim 41, wherein the coordinating solvent is a high-boiling point coordinating solvent having a boiling point range between about 100° to about 400° C.

45. The method according to claim 41, wherein the heating steps are carried out between approximately 250–380° C.

46. A biological labeling reagent produced by the method according to claim 41.

47. An LED produced by the method of claim 41.

48. A method of synthesizing rice-shaped CdSe nanocrystals, comprising the steps of:
(a) combining a cadmium precursor and a coordinating solvent to form a solution upon heating, wherein the cadmium precursor is selected from the group consisting of Cd-ODPA complex, Cd-TDPA complex, and any other Cd phosphonic complex; and
(b) admixing an elemental chalcogenic precursor with the solution at a temperature sufficient to form rice-shaped CdSe nanocrystals, wherein the chalcogenic precursor is selected from the group consisting of Se-TBP, Se-TOP, and any other Se phosphine compound.

49. The method according to claim 48, wherein the coordinating solvent is a phosphine oxide.

50. The method according to claim 49, wherein the phosphine oxide is selected from the group consisting of trioctylphosphine oxide (TOPO) and tribntylphosphine oxide (TBPO).

51. The method according to claim 48, wherein the coordinating solvent is a high-boiling point coordinating solvent having a boiling point range between about 100° to about 400° C.

52. The method according to claim 48, wherein the heating steps are carried out between approximately 250–380° C.

53. A biological labeling reagent produced by the method according to claim 48.

54. An LED produced by the method according to claim 48.

55. A catalyst produced by the method according to claim 48.

56. A method of synthesizing branched CdSe nanocrystals, comprising the steps of:
(a) combining a cadmium precursor and a coordinating solvent to form a solution upon heating, wherein the cadmium precursor is selected from the group consisting of Cd-ODPA complex, Cd-TDPA complex, and any other Cd phosphonic complex; and
(b) admixing an elemental chalcogenic precursor with the solution at a temperature sufficient to form branched CdSe nanocrystals, wherein the chalcogenic precursor is selected from the group consisting of Se-TBP, Se-TOP, and any other Se phosphine compound.

57. The method according to claim 56, wherein the coordinating solvent is a phosphine oxide.

58. The method according to claim 57, wherein the phosphine oxide is selected from the group consisting of trioctylphosphine oxide (TOPO) and tributylphosphine oxide (TBPO).

59. The method according to claim 56, wherein the coordinating solvent is a high-boiling point coordinating solvent having a boiling point range between about 100° to about 400° C.

60. The method according to claim 56, wherein the heating steps are carried out between approximately 250–380° C.

61. A catalyst produced by the method according to claim 56.

62. A solar cell produced by the method according to claim 56.

63. A catalyst produced by the method according to claim 56.

64. A method of synthesizing colloidal nanocrystals, comprising the steps of:
(a) combining a metal oxide or metal salt-precursor, a ligand, and a coordinating solvent to form a metal complex, wherein the metal ion is selected from a group IV metal or a transition metal; and
(b) admixing an elemental chalcogenic precursor with the metal complex at a temperature sufficient to form rod-shaped nanocrystals, wherein the photoluminescence band-edge emission line of the nanocrystals at the focusing point of size distribution is characterized by a FWHM of about 30 nm or less.

65. The method according to claim 64, wherein the transition metal ion is selected from the group consisting of Cd, Zn, Hg, Cu, Ag, Ni, Co, Fe, Mn, Ti, and Zr.

66. The method according to claim 64, wherein the group IV metal ion is selected from the group consisting of Sn and Pb.

67. The method according to claim 64, wherein the metal salt precursor is selected from the group consisting of metal halides, metal carboxylates, metal carbonates, and any other salt that is capable of dissolving in the ligand and coordinating solvent.

68. The method according to claim 64, wherein the ligand is selected from the group consisting of long-chain fatty amines, long-chain fatty acids, phosphonic acids, and phosphine oxides.

69. The method according to claim 64, wherein the ligand and the coordinating solvent are the same chemical.

70. A method of synthesizing colloidal nanocrystals, comprising the steps of:
(a) combining a metal oxide or metal salt precursor, a ligand, and a coordinating solvent to form a metal complex, wherein the metal ion is selected from Cd, Zn, or Hg; and
(b) admixing an elemental chalcogenic precursor with the metal complex at a temperature sufficient to form rod-shaped, rice-shaped, or branched nanocrystals.

71. The method according to claim 70, wherein the ligand is selected from long-chain fatty amines, long-chain fatty acids, phosphonic acids, phosphine oxides, or any combination thereof.

72. The method according to claim 70, wherein the ligand and the coordinating solvent are the same chemical.

73. A method of synthesizing CdSe, CdTe, or CdS nanocrystals, comprising the steps of:

(a) combining CdO or a cadmium salt precursor, a ligand, and a coordinating solvent to form a metal complex; and (b) admixing an elemental chalcogenic precursor with the cadmium complex at a temperature sufficient to form rod-shaped nanocrystals, wherein the elemental chalcogenic precursor is selected from the group consisting of Se, Te, and S, and wherein the nanocrystals are essentially monodisperse in the size range from about 2 nm to about 6 nm, with a standard deviation from about 5% to about 10%.

74. The method of synthesizing CdSe nanocrystals of claim 73, wherein the CdSe nanocrystals are essentially monodisperse in the size range from about 1.5 nm to greater than about 25 nm, with a standard deviation from about 5% to about 10%.

* * * * *